(12) United States Patent
Hashimoto et al.

(10) Patent No.: US 8,048,594 B2
(45) Date of Patent: Nov. 1, 2011

(54) PHOTOMASK BLANK, PHOTOMASK, AND METHODS OF MANUFACTURING THE SAME

(75) Inventors: Masahiro Hashimoto, Shinjuku-ku (JP); Hideaki Mitsui, Shinjuku-ku (JP)

(73) Assignee: Hoya Corporation, Tokyo (JP)

( * ) Notice: Subject to any disclaimer, the term of this patent is extended or adjusted under 35 U.S.C. 154(b) by 16 days.

(21) Appl. No.: 12/562,617

(22) Filed: Sep. 18, 2009

(65) Prior Publication Data

US 2010/0075236 A1   Mar. 25, 2010

(30) Foreign Application Priority Data

Sep. 19, 2008 (JP) ................. 2008-240570

(51) Int. Cl.
*G03F 1/00* (2006.01)

(52) U.S. Cl. ......................................... 430/5

(58) Field of Classification Search ............ 430/5, 322, 430/323; 428/428, 430; 378/35
See application file for complete search history.

(56) References Cited

U.S. PATENT DOCUMENTS

| 2003/0203290 A1* | 10/2003 | Misaka .............. 430/5 |
| 2006/0177746 A1* | 8/2006 | Yoshikawa et al. ........... 430/5 |
| 2007/0212618 A1 | 9/2007 | Yoshikawa et al. |

FOREIGN PATENT DOCUMENTS

| JP | 2007-241065 A | 9/2007 |
| JP | 2007-241136 A | 9/2007 |

* cited by examiner

*Primary Examiner* — Stephen Rosasco
(74) *Attorney, Agent, or Firm* — Sughrue Mion, PLLC

(57) ABSTRACT

A photomask blank is for fabricating a phase shift mask having a light-transmissive substrate provided with a phase shift part adapted to give a predetermined phase difference to transmitted exposure light. The phase shift part is a dug-down part formed by digging down the light-transmissive substrate from a surface thereof to a digging depth adapted to produce the predetermined phase difference with respect to exposure light transmitted through the light-transmissive substrate at a portion where the phase shift part is not provided. The photomask blank includes a light-shielding part formed in a peripheral area around a transfer pattern area of the surface of the light-transmissive substrate and adapted to shield exposure light and further includes an etching mask film formed in the transfer pattern area of the surface of the light-transmissive substrate and made of a material being substantially dry-etchable with a chlorine-based gas, but not substantially dry-etchable with a fluorine-based gas, the etching mask film serving as an etching mask at least until the digging depth is reached when forming the dug-down part.

18 Claims, 8 Drawing Sheets

PHOTOMASK BLANK, PHOTOMASK, AND METHODS OF MANUFACTURING THE SAME

This application is based upon and claims the benefit of priority from Japanese Patent Application No. 2008-240570, filed on Sep. 19, 2008, the disclosure of which is incorporated herein in its entirety by reference.

TECHNICAL FIELD

This invention relates to a photomask blank for fabricating a photomask having a phase shift part (phase shift pattern) and to a photomask fabricated using such a photomask blank and further relates to methods of manufacturing them.

BACKGROUND ART

The miniaturization of semiconductor devices and the like is advantageous in bringing about an improvement in performance and function (higher-speed operation, lower power consumption, etc.) and a reduction in cost and thus has been accelerated more and more. The lithography technique has been supporting this miniaturization and transfer masks are a key technique along with exposure apparatuses and resist materials.

In recent years, the development of the DRAM half-pitch (hp) 45 nm to 32 nm generations according to the semiconductor device design rule has been progressing. This corresponds to ¼ to ⅙ of a wavelength 193 nm of ArF excimer laser exposure light. Particularly, in the hp45 nm and subsequent generations, only the application of the resolution enhancement technology (RET) such as the conventional phase shift method, oblique illumination method, and pupil filter method and the optical proximity correction (OPC) technique has been becoming insufficient and the hyper-NA technique (immersion lithography) and the double exposure (double patterning) technique have been becoming necessary.

The phase shift method is a technique of giving a predetermined phase difference to exposure light transmitted through a phase shift part, thereby improving the resolution of a transfer pattern using interference of light.

As photomasks improved in resolution by the phase shift method, there are a substrate dug-down type in which a phase shift part is provided by digging down a quartz substrate by etching or the like, and a type in which a phase shift part is provided by patterning a phase shift film formed on a substrate.

As photomasks of the substrate dug-down (carved) type, there are a Levenson-type phase shift mask, an enhancer-type phase shift mask, a chromeless phase shift mask, and so on. As chromeless phase shift masks, there are a type in which a light-shielding layer on lines is completely removed, and a type in which a light-shielding layer on lines is patterned (so-called zebra type). A Levenson-type phase shift mask or a chromeless phase shift mask of the type in which a light-shielding layer in a transfer area is completely removed is also called an alternative phase shifter which is a phase shift mask of the type in which exposure light incident on a phase shift part is transmitted at 100%. An enhancer-type phase shift mask is provided with a light-shielding part, a transmittance control part (phase 360° inversion=0°), and a 180° inversion part formed by digging down a glass. In any type, it is necessary to form a light-shielding part (light-shielding band) in an edge area (peripheral area) along four sides in the photomask (reticle).

As photomasks of the type in which a phase shift part is provided by patterning a phase shift film formed on a substrate, there are a halftone phase shift mask and so on.

As a photomask blank for fabricating such a chromeless phase shift mask described above, there is known a mask blank for a chromeless phase shift mask, having a structure in which, for example, a light-shielding film (having sufficient light-shielding performance (optical density: 3.0 to 4.0) for forming a light-shielding band) comprising a first layer (corresponding to an etching mask film) containing Cr and a second layer mainly composed of MoSi, which are laminated in this order, is formed on an upper surface of a substrate (see JP-A-2007-241136 (Patent Document 1)).

As a photomask blank for fabricating such a halftone phase shift mask described above, there is known a mask blank for a halftone mask, having a stacked structure in which, for example, there is formed, on an upper surface of a phase shift film (MoSi-based film or the like), an etching mask film (Cr-based film or the like) made of a material having etching selectivity to an etching gas (fluorine-based gas or the like) to be used for etching the phase shift film, there is formed, on an upper surface of the etching mask film, a light-shielding film (MoSi-based film or the like) having etching selectivity to the etching mask film and having sufficient light-shielding performance for forming a light-shielding band alone or in a laminated structure with the etching mask film, and further, an antireflection film (Cr-based film or the like) is formed on the light-shielding film (see JP-A-2007-241065 (Patent Document 2)).

SUMMARY OF THE INVENTION

For forming a fine phase shift part (phase shift pattern) on the substrate (in the case of the chromeless phase shift mask) or in the phase shift film (in the case of the halftone phase shift mask) with high CD accuracy (CD accuracy required for the hp45 nm and subsequent generations), it is most preferable that a resist pattern formed in a resist film by EB writing or the like be faithfully transferred to the etching mask film.

However, in the case of using either of the techniques (mask blanks) described in Patent Documents 1 and 2, the light-shielding film exists as an upper layer on the etching mask film. In the phase shift mask, the light-shielding film is required for forming a light-shielding part (light-shielding band) in a blind area (peripheral area around a transfer pattern area). The light-shielding film is required to have a predetermined light-shielding performance (e.g. OD≦3) and thus to have a predetermined thickness or more.

In the case of using either of the techniques (mask blanks) described in Patent Documents 1 and 2, a mask pattern formed in a resist film is transferred to the light-shielding film by dry etching, then the mask pattern is transferred to the etching mask film by dry etching using the mask pattern transferred to the light-shielding film as a mask, and then the mask pattern is transferred to the substrate or the phase shift film by dry etching using the mask pattern transferred to the etching mask film as a mask.

In either of the techniques described in Patent Documents 1 and 2, since the mask pattern is transferred to the etching mask film through the thick light-shielding film, it is difficult to improve the CD accuracy and thus to adapt to the generations that require higher accuracy.

It is therefore an object of this invention to provide a photomask blank that makes it possible to form a fine phase shift part (phase shift pattern) on a substrate (in the case of a chromeless phase shift mask) or in a phase shift film (in the case of a halftone phase shift mask) with high CD accuracy (CD accuracy required for the hp45 nm and subsequent generations).

Other objects of the present invention will become clear as the description proceeds.

According to an aspect of the present invention, there is provided a photomask blank for fabricating a phase shift mask having a light-transmissive substrate provided with a phase shift part adapted to give a predetermined phase difference to transmitted exposure light, wherein the phase shift part is a dug-down part formed by digging down the light-transmissive substrate from a surface thereof to a digging depth adapted to produce the predetermined phase difference with respect to exposure light transmitted through the light-transmissive substrate at a portion where the phase shift part is not provided, the photomask blank comprising a light-shielding part formed in a peripheral area around a transfer pattern area of the surface of the light-transmissive substrate and adapted to shield exposure light; and an etching mask film formed in the transfer pattern area of the surface of the light-transmissive substrate and made of a material being substantially dry-etchable with a chlorine-based gas, but not substantially dry-etchable with a fluorine-based gas, the etching mask film serving as an etching mask at least until the digging depth is reached when forming the dug-down part.

According to another aspect of the present invention, there is provided a photomask blank for fabricating a phase shift mask having a light-transmissive substrate provided with a phase shift part adapted to give a predetermined phase difference to transmitted exposure light, wherein the phase shift part is a phase shift film formed on an upper surface of the light-transmissive substrate and adapted to give a predetermined phase change amount to the transmitted exposure light, the photomask blank comprising a light-shielding part formed in a peripheral area around a transfer pattern area of a surface of the phase shift film and adapted to shield exposure light; and an etching mask film formed in the transfer pattern area of the surface of the phase shift film and made of a material being substantially dry-etchable with a chlorine-based gas, but not substantially dry-etchable with a fluorine-based gas, the etching mask film serving as an etching mask at least until a transfer pattern is formed in the phase shift film by dry etching with a fluorine-based gas.

According to still another aspect of the present invention, there is provided a photomask fabricated using either of the above-mentioned photomask.

According to a further aspect of the present invention, there is provided a method of manufacturing a phase shift mask having a light-transmissive substrate provided with a phase shift part adapted to give a predetermined phase difference to transmitted exposure light, the method comprising forming a light-shielding film on an upper surface of the light-transmissive substrate, the light-shielding film adapted to shield exposure light, dry-etching the light-shielding film using a resist film pattern as a mask, thereby forming a light-shielding part in a peripheral area around a transfer pattern area, forming an etching mask film on the upper surface of the light-transmissive substrate after the step of dry-etching, dry-etching the etching mask film using a resist film pattern as a mask, thereby forming an etching mask film pattern, and dry-etching the light-transmissive substrate using the etching mask film pattern as a mask, thereby forming the phase shift part by digging down the light-transmissive substrate from the upper surface thereof to a digging depth adapted to produce the predetermined phase difference.

According to still further aspect of the present invention, there is provided a method of manufacturing a phase shift mask having a light-transmissive substrate provided with a phase shift part adapted to give a predetermined phase difference to transmitted exposure light, the method comprising forming a phase shift film on an upper surface of the light-transmissive substrate, the phase shift film adapted to give a predetermined phase change amount to transmitted exposure light, forming a light-shielding film on an upper surface of the phase shift film, the light-shielding film adapted to shield exposure light, dry-etching the light-shielding film using a resist film pattern as a mask, thereby forming a light-shielding part in a peripheral area around a transfer pattern area, forming an etching mask film on the upper surface of the phase shift film after the step of dry-etching, dry-etching the etching mask film using a resist film pattern as a mask, thereby forming an etching mask film pattern, and dry-etching the phase shift film using the etching mask film pattern as a mask, thereby forming the phase shift part.

With the structure in which, as described above, the light-shielding part adapted to shield exposure light is formed in the peripheral area around the transfer pattern area of the surface, where the phase shift part is to be formed, of the substrate or the surface of the phase shift film to be formed with the phase shift part and the etching mask film serving as an etching mask until the phase shift part is formed by dry etching on the substrate or in the phase shift film is formed in the transfer pattern area, the following effects can be obtained.

The etching mask film having a thickness much smaller than that of the light-shielding film is provided on or over the upper surface of the substrate in the transfer pattern area being the area where the transfer pattern is to be formed and being the area where the phase shift part is to be formed, and it is possible to provide a resist film immediately above, i.e. directly on, the etching mask film. Therefore, the thickness of the resist film is sufficient if it is enough to transfer the transfer pattern to the etching mask film by dry etching. Further, it is possible to transfer the transfer pattern, transferred to the etching mask film from the resist film, directly to the substrate or the phase shift film by dry etching and thus it is not necessary to transfer the transfer pattern through another film. This makes it possible to improve the pattern CD accuracy (satisfy the CD accuracy required for the hp45 nm and subsequent generations) and simultaneously to maintain desired light-shielding performance (light-shielding performance at the conventional level or more) of the light-shielding part.

DESCRIPTION OF THE EMBODIMENT

Hereinbelow, some embodiments of this invention will be described with reference to the drawings.

A photomask blank according to a first embodiment of the present invention is for fabricating a phase shift mask having a light-transmissive substrate provided with a phase shift part adapted to give a predetermined phase difference to transmitted exposure light, wherein the phase shift part is a dug-down part formed by digging down the light-transmissive substrate from a surface thereof to a digging depth adapted to produce the predetermined phase difference with respect to exposure light transmitted through the light-transmissive substrate at a portion where the phase shift part is not provided, the photomask blank comprising a light-shielding part formed in a peripheral area around a transfer pattern area of the surface of the light-transmissive substrate and adapted to shield exposure light; and an etching mask film formed in the transfer pattern area of the surface of the light-transmissive substrate and made of a material being substantially dry-etchable with a chlorine-based gas, but not substantially dry-etchable with a fluorine-based gas, the etching mask film serving as an etching mask at least until the digging depth is reached when forming the dug-own part.

According to the above-mentioned photomask blank, in the state where the light-shielding part (light-shielding band) is formed in advance in the peripheral area (blind area) around the transfer pattern area (thus in the state where there is no thick light-shielding film any longer in the transfer pattern area), the etching mask film is formed directly on the upper surface of the substrate (in contact with the substrate) in the transfer pattern area. Thus, a transfer pattern formed in a resist film can be transferred directly (not through the light-shielding film as in the prior art) to the etching mask film. Therefore, using the etching mask film formed with the transfer pattern as a mask, it is possible to form a phase shift pattern (phase shift part) directly (not through the light-shielding film as in the prior art) on the substrate. Accordingly, it is possible to provide a chromeless phase shift mask blank that makes it possible to form a fine phase shift pattern (phase shift part) on a substrate with high CD accuracy (CD accuracy required for the hp45 nm and subsequent generations) and further to provide a photomask fabricated using such a chromeless phase shift mask blank.

Figure 1:
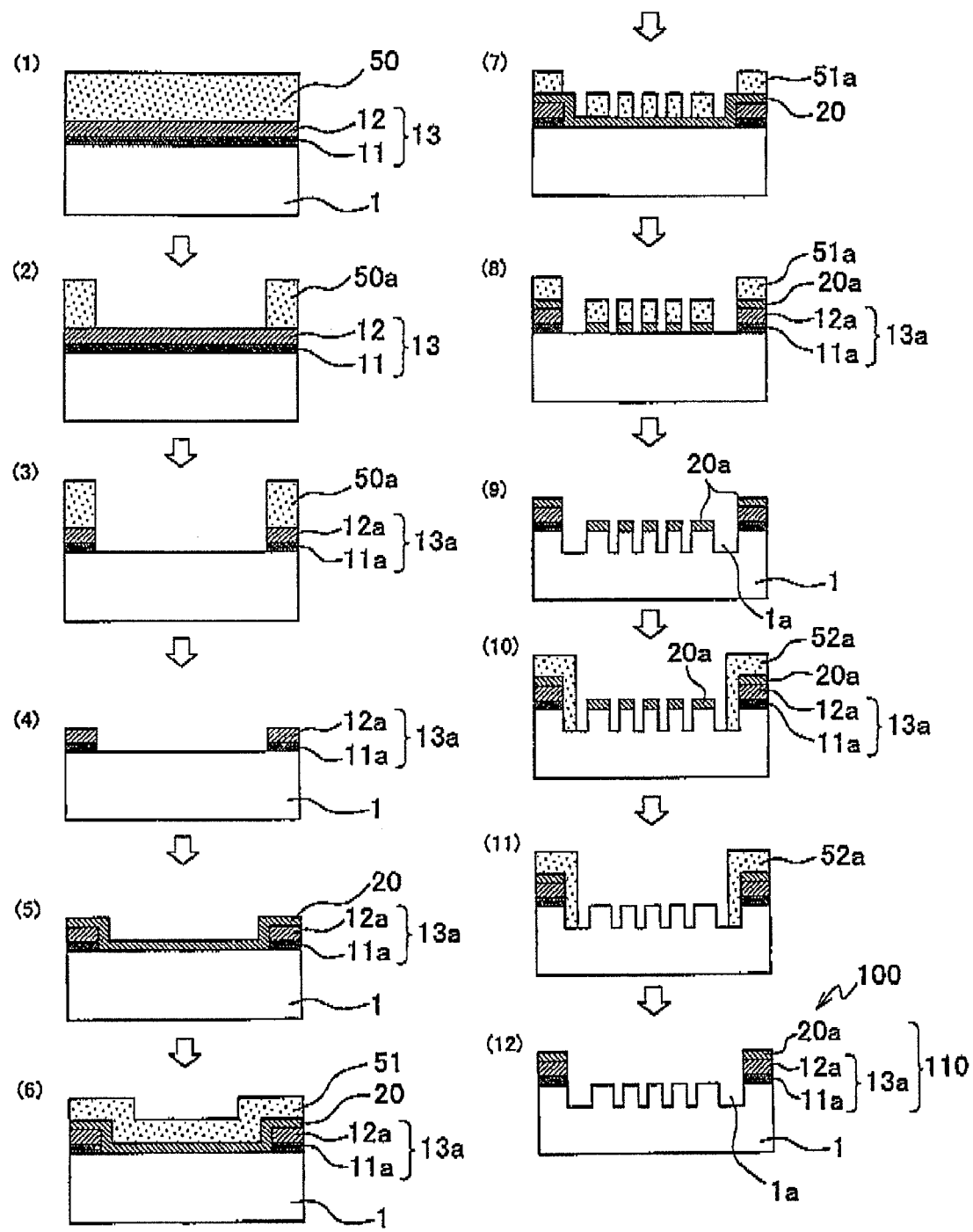
FIG. 1 shows exemplary sectional views for explaining photomask manufacturing processes according to Example 1 of this invention.

In FIG. 1, (5) shows a specific example of a photomask blank according to the first embodiment of this invention. The photomask blank shown at (5) in FIG. 1 is used for fabricating a phase shift mask of the substrate dug-down type. This photomask blank has, on a light-transmissive substrate 1, a light-shielding part (light-shielding band) 13a in contact with the substrate 1 in a peripheral area (blind area) around a transfer pattern area and an etching mask film 20 in contact with the substrate 1 in the transfer pattern area.

In FIG. 1, (12) shows one example of a phase shift mask of the substrate dug-down type. This photomask has a dug-down part 1a on the light-transmissive substrate 1 and a light-shielding part (light-shielding band) 110 in contact with the substrate 1 in the peripheral area around the transfer pattern area.

A photomask blank according to a second embodiment of the present invention is for fabricating a phase shift mask having a light-transmissive substrate provided with a phase shift part adapted to give a predetermined phase difference to transmitted exposure light, wherein the phase shift part is a phase shift film formed on an upper surface of the light-transmissive substrate and adapted to give a predetermined phase change amount to the transmitted exposure light, the photomask blank comprising a light-shielding part formed in a peripheral area around a transfer pattern area of a surface of the phase shift film and adapted to shield exposure light, and an etching mask film formed in the transfer pattern area of the surface of the phase shift film and made of a material being substantially dry-etchable with a chlorine-based gas, but not substantially dry-etchable with a fluorine-based gas, the etching mask film serving as an etching mask at least until a transfer pattern is formed in the phase shift film by dry etching with a fluorine-based gas.

According to the above-mentioned photomask blank, in the state where the light-shielding part (light-shielding band) is formed in advance in the peripheral area (blind area) around the transfer pattern area (thus in the state where there is no thick light-shielding film any longer in the transfer pattern area), the etching mask film is formed directly on the upper surface of the phase shift film (in contact with the phase shift film) in the transfer pattern area, Thus, a transfer pattern formed in a resist film can be transferred directly (not through the light-shielding film as in the prior art) to the etching mask film. Therefore, using the etching mask film formed with the transfer pattern as a mask, it is possible to form a phase shift pattern (phase shift part) directly (not through the light-shielding film as in the prior art) on the phase shift film. Accordingly, it is possible to provide a halftone phase shift mask blank that makes it possible to form a fine phase shift pattern (phase shift part) on a phase shift film with high CD accuracy (CD accuracy required for the hp45 nm and subsequent generations) and further to provide a photomask fabricated using such a halftone phase shift mask blank.

Figure 2:
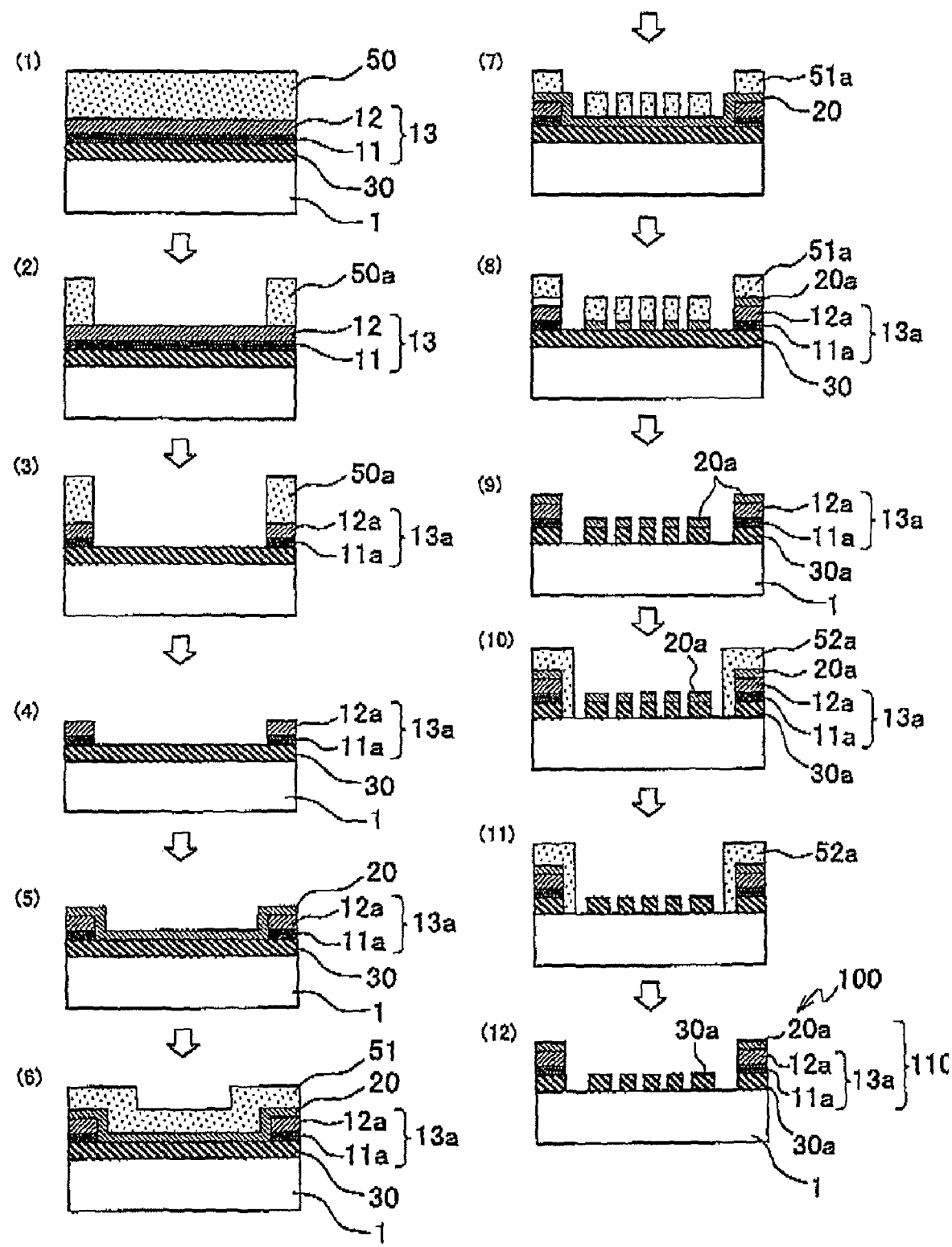
FIG. 2 shows exemplary sectional views for explaining photomask manufacturing processes according to Example 2 of this invention.

In FIG. 2, (5) shows a specific example of a photomask blank according to the second embodiment of this invention. The photomask blank shown at (5) in FIG. 2 is used for fabricating a phase shift mask of the type in which a substrate is not basically dug down and a phase shift part is formed by a halftone phase shift film. This photomask blank has a halftone phase shift film 30 on an upper surface (the front surface side) of a light-transmissive substrate 1 and further has, on the halftone phase shift film 30, a light-shielding part (light-shielding band) 13a in contact with the halftone phase shift film 30 in a peripheral area (blind area) around a transfer pattern area and an etching mask film 20 in contact with the halftone phase shift film 30 in the transfer pattern area.

In FIG. 2, (12) shows one example of a phase shift mask of this type. This photomask has a phase shift film pattern 30a on the light-transmissive substrate 1 and a light-shielding part (light-shielding band) 110 in contact with the phase shift film pattern 30a in the peripheral area around the transfer pattern area.

Figure 5:
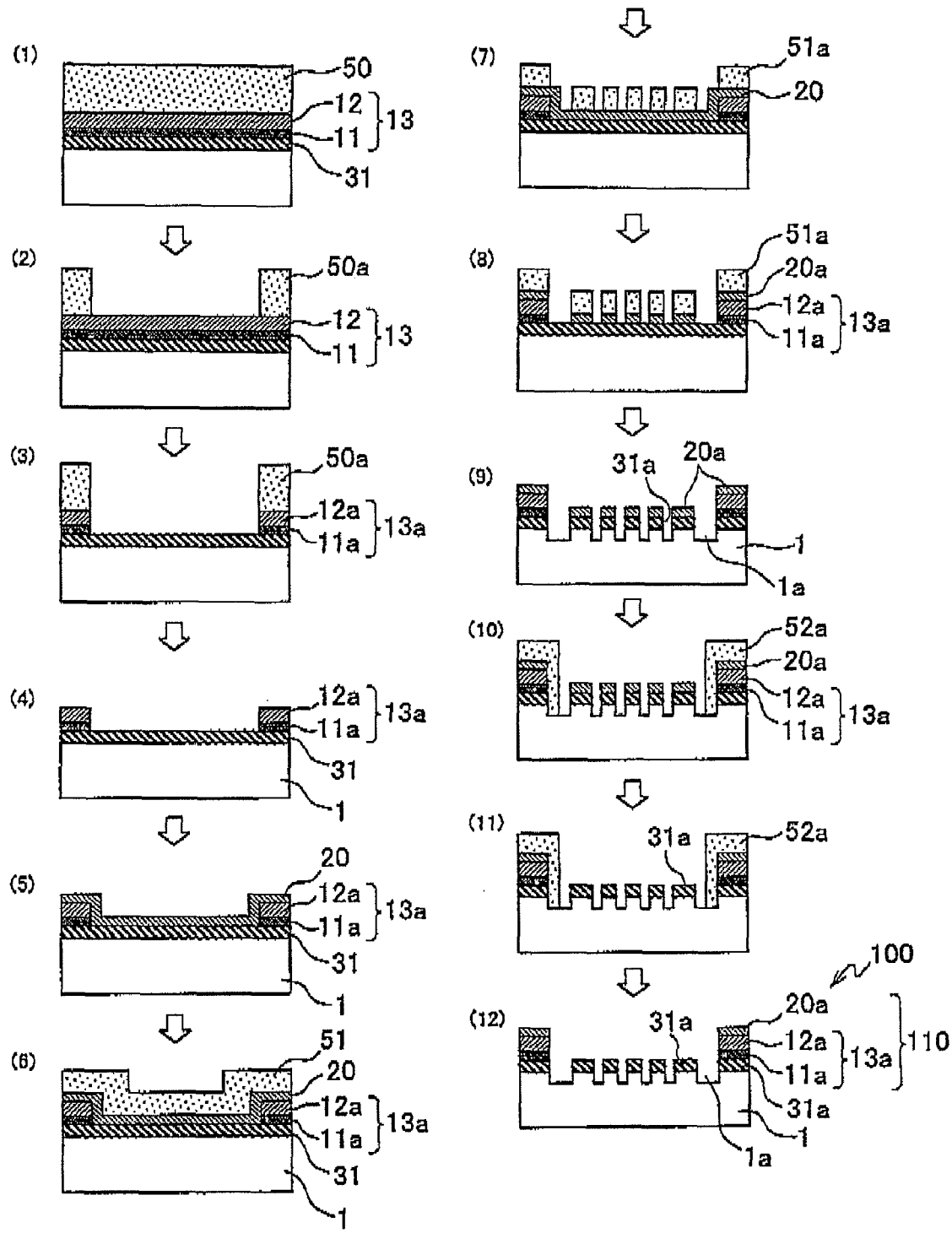
FIG. 5 shows exemplary sectional views for explaining photomask manufacturing processes according to Example 5 of this invention.

In FIG. 5, (5) shows a specific example of a photomask blank according to a third embodiment of this invention. The photomask blank shown at (6) in FIG. 5 is used for fabricating a phase shift mask of the type in which a high-transmittance phase shift part is formed by providing a halftone phase shift film and further by digging down a substrate. This photomask blank has a high-transmittance halftone phase shift film 31 on an upper surface of a light-transmissive substrate 1 and further has, on the halftone phase shift film 31, a light-shielding part (light-shielding band) 13a in contact with the halftone phase shift film 31 in a peripheral area (blind area) around a transfer pattern area and an etching mask film 20 in contact with the halftone phase shift film 31 in the transfer pattern area.

In FIG. 5, (12) shows one example of a phase shift mask of this type. As shown at (12) in FIG. 5, this type of phase shift mask has a phase shift part configured by forming a thin halftone phase shift film pattern 31a on a dug-down part 1a of the substrate 1. In the case of the single-layer phase shift film shown in the second embodiment, a considerably large thickness is required for giving a predetermined phase difference (phase shift amount) to exposure light and simultaneously controlling the transmittance to a predetermined value for the exposure light. In view of this, the photomask blank according to the third embodiment realizes high transmittance for exposure light by reducing the thickness of the single-layer phase shift film and further realizes that a predetermined phase difference is given to the exposure light by providing the dug-down part 1a, having a depth corresponding to a phase shift amount lessened by reducing the film thickness, at a substrate exposed portion where the halftone phase shift film pattern 31a is not formed.

Figure 6:
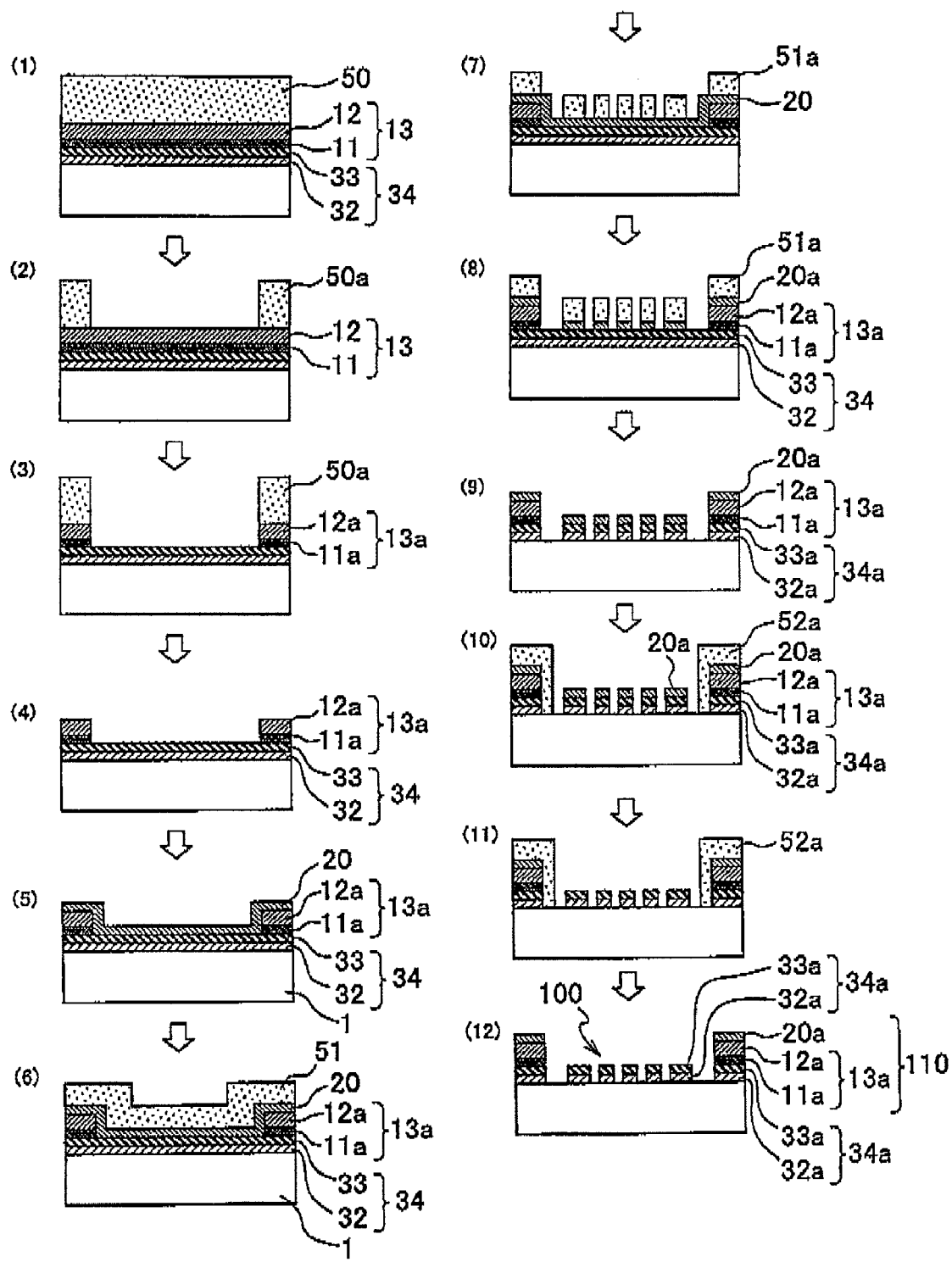
FIG. 6 shows exemplary sectional views for explaining photomask manufacturing processes according to Example 6 of this invention.

In FIG. 6, (5) shows a specific example of a photomask blank according to a fourth embodiment of this invention. The photomask blank shown at (5) in FIG. 6 is used for fabricating a phase shift mask of the type in which a substrate is not dug down and a high-transmittance phase shift part is formed by providing a high-transmittance halftone phase shift film. In order to obtain high transmittance, the halftone phase shift film comprises two layers, i.e. a phase control layer and a transmittance control layer. This photomask blank has, on an upper surface of a light-transmissive substrate 1, a halftone phase shift film 34 composed of a phase control layer 33 and a transmittance control layer 32 and further has, on the halftone phase shift film 34, a light-shielding part (light-shielding band) 13a in contact with the halftone phase shift film 34 in a peripheral area (blind area) around a transfer pattern area and an etching mask film 20 in contact with the halftone phase shift film 34 in the transfer pattern area.

In FIG. 6, (12) shows one example of a phase shift mask of this type. This photomask has a phase shift film pattern 34a on the light-transmissive substrate 1 and a light-shielding part (light-shielding band) 110 in contact with the phase shift film pattern 34a in the peripheral area around the transfer pattern area.

As described above, the light-shielding part (light-shielding band) is formed in advance in the peripheral area (blind area) around the transfer pattern area and then the etching mask film and a resist film are formed in this order, thereby transferring a resist pattern, formed in the resist film, directly (not through the light-shielding film as in the prior art) to the etching mask film by dry etching.

Herein, a description will be given of one example of methods of manufacturing the above-mentioned phase shift masks.

(Process 1)

Forming a light-shielding film having a predetermined light-shielding performance (optical density). In this case, the thickness of the light-shielding film can be set to a value that satisfies the predetermined light-shielding performance in a laminated structure of the light-shielding film and an etching mask film.

(Process 2)

Removing the light-shielding film in a transfer pattern area by etching to form a light-shielding part (light-shielding band) in a peripheral area around the transfer pattern area.

(Process 3)

Forming an etching mask film on or over an upper surface of a substrate in the transfer pattern area and, if necessary, on an upper surface of the light-shielding part (light-shielding band) in the peripheral area. The etching mask film has etching selectivity (etching resistance) to an etching gas in etching the substrate (in the case of a chromeless phase shift mask) or a phase shift film (in the case of a halftone phase shift mask), The composite at this stage is called a mask blank.

(Process 4)

Mask fabrication processes form a resist pattern, i.e. a transfer pattern (representing a pattern the same as a transfer pattern to be formed on a mask), in a resist film formed on an upper surface of the etching mask film, transfer the transfer pattern to the etching mask film by dry etching using the resist pattern as a mask, and further, using the transfer pattern transferred to the etching mask film as a mask, form a phase shift pattern (phase shift part) by dry-etching the substrate (in the case of the chromeless phase shift mask) or the phase shift film (in the case of the halftone phase shift mask).

As the light-shielding film for forming the light-shielding part, a metal film containing a metal can be used. As such a metal film, there can be cited a film made of chromium, tantalum, molybdenum, titanium, hafnium, tungsten, an alloy containing such an element, or a material containing such an element or alloy (e.g. a material containing such an element or alloy and at least one of oxygen, nitrogen, silicon, and carbon). It is possible to use a plural-layer structure with layers of different compositions formed stepwise or a plural-layer structure in which the composition changes continuously.

As the etching mask film, a metal film containing a metal can be used. As such a metal film, there can be cited a film made of chromium, tantalum, molybdenum, titanium, hafnium, tungsten, an alloy containing such an element, or a material containing such an element or alloy (e.g. a material containing such an element or alloy and at least one of oxygen, nitrogen, silicon, and carbon). It is possible to use a single-layer structure, a plural-layer structure with layers of different compositions formed stepwise, or a plural-layer structure in which the composition changes continuously.

It is preferable that the etching mask film can be stripped by dry etching or wet etching without damaging the substrate and the other layer.

The etching selectivity of the etching mask film to the substrate or the other layer (etching rate of the etching mask film/etching rate of the substrate or the other layer) is preferably ⅕ or less.

The sheet resistance of the substrate formed with the etching mask film is preferably 500Ω/square or less. This is for providing the photomask blank having a conductivity large enough to prevent charge-up during electron beam writing on the resist film formed in contact with the etching mask film.

The phase shift film is preferably made of a material that is substantially dry-etchable with a fluorine-based gas, but not substantially dry-etchable with a chlorine-based gas.

As the phase shift film, use can be made of, for example, a silicon-containing film containing silicon. As the silicon-containing film, there can be cited a silicon film, a metal silicide film containing silicon and a metal such as chromium, tantalum, molybdenum, titanium, hafnium, or tungsten, or a film containing at least one of oxygen, nitrogen, and carbon in a silicon film or a metal silicide film.

As the phase shift film, use can be made of, for example, a film mainly composed of transition metal silicide oxide, transition metal silicide nitride, transition metal silicide oxynitride, transition metal silicide oxycarbide, transition metal silicide nitride carbide, or transition metal silicide oxycarbonitride. As the phase shift film, use can be made of, for example, a halftone film such as a molybdenum-based (MoSiON, MoSiN, MoSiO, or the like) film, a tungsten-based (WYSiON, WSiN, WSiO, or the like) film, or a silicon-based (SiN, SiON, or the like) film.

As the phase shift film, use can be made of, for example, a halftone film composed of two layers, i.e. a phase adjusting layer for mainly controlling the phase of exposure light and a transmittance adjusting layer for mainly controlling the transmittance of exposure light, Herein, as a material of the transmittance adjusting layer, use can be made of a material containing one kind or two or more kinds selected from metals and silicon, or an oxide, nitride, oxynitride, carbide, or the like thereof, Specifically, there can be cited a material containing one kind or two or more kinds selected from aluminum, titanium, vanadium, chromium, zirconium, niobium, molybdenum, lanthanum, tantalum, tungsten, silicon, and hafnium, or an oxide, nitride, oxynitride, carbide, or the like thereof. As the phase adjusting layer, it is preferable to use a silicon-based thin film made of silicon oxide, silicon nitride, silicon oxynitride, or the like because relatively high transmittance can be easily obtained for exposure light in the ultraviolet region.

The light-shielding part is preferably made of a material mainly containing one of chromium, chromium nitride, chromium oxide, chromium oxynitride, and chromium oxycarbonitride.

This is because such a material is excellent in various properties as a material of the light-shielding film. Further, using the Cr-based material as both a material of the light-shielding part and a material of the etching mask film, the film for forming the light-shielding part and the etching mask film can be formed by the same film forming apparatus or a film forming apparatus having a single film forming chamber. It is preferable that, after forming the light-shielding part (light-shielding band) made of the Cr-based material, the etching mask film made of the Cr-based material be formed also on the upper surface of the light-shielding part in the peripheral area. This is because the etching mask film can be used as an antireflection film for the light-shielding part (light-shielding band) made of the Cr-based material.

As a film material forming the light-shielding part, use can be made of, for example, chromium alone or a material containing chromium and at least one kind of elements such as oxygen, nitrogen, carbon, and hydrogen (Cr-containing material). As a film structure of the light-shielding part, a single-layer structure or a plural-layer structure made of the above-mentioned film material/materials can be employed. In the case of the plural-layer structure, it is possible to use a plural-layer structure with layers of different compositions formed stepwise or a film structure in which the composition changes continuously.

A specific example of the plural-layer structure is, for example, a laminated film composed of a back-surface antireflection layer (having a thickness of, for example, 10 nm to 20 nm) made of chromium oxycarbonitride (CrOCN), a light-shielding layer (having a thickness of, for example, 25 nm to 60 nm) made of chromium oxynitride (CrON), and an antireflection layer (having a thickness of, for example, 15 nm to 30 nm) made of chromium oxycarbonitride (CrOCN).

The total thickness of the laminated film forming the light-shielding part is preferably 50 nm to 100 nm. According to this structure, the light-shielding part (light-shielding band) can have a sufficient optical density.

The light-shielding part is preferably made of a material mainly containing tantalum. This is because when removing the unnecessary etching mask film, made of the Cr-based material, by dry etching using a chlorine-based gas, it is not necessary to protect the light-shielding part (light-shielding band) made of the Ta-based material.

As a film material forming the light-shielding part, use can be made of, for example, tantalum alone or a material containing tantalum and at least one kind of elements such as oxygen, nitrogen, carbon, and hydrogen (Ta-containing material). As a film structure of the light-shielding part, a single-layer structure or a plural-layer structure made of the above-mentioned film material/materials can be employed. In the case of the plural-layer structure, it is possible to use a plural-layer structure with layers of different compositions formed stepwise or a film structure in which the composition changes continuously.

A specific example of the plural-layer structure is, for example, a laminated film composed of a light-shielding layer (having a thickness of, for example, 40 nm to 80 nm) made of tantalum nitride (TaN) and an antireflection layer (having a thickness of, for example, 10 nm to 30 nm) made of tantalum oxide (TaO).

The total thickness of the laminated film forming the light-shielding part is preferably 50 nm to 100 nm. According to this structure, the light-shielding part (light-shielding band) can have a sufficient optical density.

The etching mask film is preferably a specific etching mask film made of a material mainly containing one of chromium, chromium nitride, chromium oxide, chromium oxynitride, and chromium oxycarbonitride. This specific etching mask film is made of a material being substantially dry-etchable with a chlorine-based gas, but not substantially dry-etchable with a fluorine-based gas and is excellent in these properties.

This specific etching mask film has etching selectivity to the substrate or the phase shift film to be subjected to dry etching with a fluorine-based gas and, even with a small thickness, serves as an etching mask at least until a transfer pattern is formed on the substrate (in the case of a chromeless phase shift mask) or in the phase shift film (in the case of a halftone phase shift mask) by the dry etching with the fluorine-based gas. By setting the thickness of the etching mask film to the above-mentioned small thickness, it is possible to form a fine phase shift pattern (phase shift part) on the substrate (in the case of the chromeless phase shift mask) or in the phase shift film (in the case of the halftone phase shift mask) with high CD accuracy (CD accuracy required for the hp45 nm and subsequent generations).

This specific etching mask film can be reduced in thickness, Further, it is excellent in processing accuracy. In addition, the etching selectivity of the etching mask film to the lower layer formed in contact therewith and the substrate is high and, therefore, the etching mask film that becomes unnecessary can be removed without damaging the substrate and the other layer.

As a material of the etching mask film, use can be made of, for example, chromium alone or a material containing chromium and at least one kind of elements such as oxygen, nitrogen, carbon, and hydrogen (Cr-containing material). As a film structure of the etching mask film, a single-layer structure made of the above-mentioned film material is often employed, but a plural-layer structure can alternatively be employed. In the case of the plural-layer structure, it is possible to use a plural-layer structure with layers of different compositions formed stepwise or a film structure in which the composition changes continuously.

As the material of the etching mask film, chromium oxycarbonitride (CrOCN) is preferable among them in terms of stress controllability (low-stress film can be formed).

The thickness of the etching mask film is preferably 5 nm to 40 nm and more preferably 5 nm to 15 nm. According to this structure, it is possible to obtain a photomask blank in which the shift amount of CD (Critical Dimension) of a to-be-etched film with respect to CD of an etching mask film (the size change amount of the pattern size of a to-be-etched film with respect to the pattern size of an etching mask film) is less than 5 nm.

The etching mask film is preferably formed also on the upper surface of the light-shielding part in the peripheral area. This is because, as described before, if, after forming the light-shielding part (light-shielding band) made of the Cr-based material, the etching mask film made of the Cr-based material is formed also on the upper surface of the light-shielding part in the peripheral area, the etching mask film can be used as an antireflection film for the light-shielding part (light-shielding band) made of the Cr-based material.

In one mode of this invention, the phase shift film is preferably made of a material mainly containing one of molybdenum silicide, molybdenum silicide nitride, molybdenum silicide oxide, and molybdenum silicide oxynitride. According to this structure, there is obtained a halftone phase shift mask having a transmittance of, for example, about 3% to 20% for ArF exposure light.

In another mode of this invention, the phase shift film preferably comprises a phase adjusting layer made of a material mainly containing silicon oxide or silicon oxynitride and a transmittance adjusting layer made of a material mainly containing tantalum or a tantalum-hafnium alloy. According to this structure, it is possible to obtain a high-transmittance halftone phase shift mask, for example, having a transmittance of 20% or more for ArF exposure light without digging down the substrate.

It is needless to say that photomasks can be fabricated using the abovementioned photomask blanks.

A method according to an embodiment of the present invention is of manufacturing a phase shift mask having a light-transmissive substrate provided with a phase shift part adapted to give a predetermined phase difference to transmitted exposure light, the method comprising forming a light-shielding film on an upper surface of the light-transmissive substrate, the light-shielding film adapted to shield exposure light, dry-etching the light-shielding film using a resist film pattern as a mask, thereby forming a light-shielding part in a peripheral area around a transfer pattern area, forming an etching mask film on the upper surface of the light-transmissive substrate after the step of dry-etching, dry-etching the etching mask film using a resist film pattern as a mask, thereby forming an etching mask film pattern, and dry-etching the light-transmissive substrate using the etching mask film pattern as a mask, thereby forming the phase shift part by digging down the light-transmissive substrate from the upper surface thereof to a digging depth adapted to produce the predetermined phase difference. According to this manufacturing method, a photomask having the same operation and effect as described above is obtained with high manufacturing process efficiency.

A method according to another embodiment of the present invention is of manufacturing a phase shift mask having a light-transmissive substrate provided with a phase shift part adapted to give a predetermined phase difference to transmitted exposure light, the method comprising forming a phase shift film on an upper surface of the light-transmissive substrate, the phase shift film adapted to give a predetermined phase change amount to transmitted exposure light, forming a light-shielding film on an upper surface of the phase shift film, the light-shielding film adapted to shield exposure light, dry-etching the light-shielding film using a resist film pattern as a mask, thereby forming a light-shielding part in a peripheral area around a transfer pattern area, forming an etching mask film on the upper surface of the phase shift film after the step of dry-etching, dry-etching the etching mask film using a resist film pattern as a mask, thereby forming an etching mask film pattern, and dry-etching the phase shift film using the etching mask film pattern as a mask, thereby forming the phase shift part. According to this manufacturing method, a photomask having the same operation and effect as those of the photomask according to the above-mentioned manufacturing method is obtained with high manufacturing process efficiency.

For dry-etching a chromium-based thin film, it is preferable to use a dry etching gas in the form of a mixed gas containing a chlorine-based gas and an oxygen gas, This is because if a chromium-based thin film made of a material containing chromium and an element such as oxygen or nitrogen is dry-etched using the above-mentioned dry etching gas, it is possible to increase the dry etching rate and thus to shorten the dry etching time so that a light-shielding film pattern with an excellent sectional shape can be formed. As the chlorine-based gas for use in the dry etching, there can be cited, for example, $Cl_2$, $SiCl_4$, HCl, $CCl_4$, $CHCl_3$, or the like.

For dry-etching a substrate to form a dug-down part or dry-etching a silicon-containing film containing silicon or a metal silicide-based thin film, use can be made of, for example, a fluorine-based gas such as $SF_6$, $CF_4$, $C2F_6$, or $CHF_3$, a mixed gas of such a fluorine-based gas and He, $H_2$, $N_2$, Ar, $C_2H_4$, $O_2$ or the like, a chlorine-based gas such as $Cl_2$ or $CH_2Cl_2$, or a mixed gas of such a chlorine-based gas and He, $H_2$, $N_2$, Ar, $C_2H_4$, or the like.

The resist is preferably a chemically amplified resist. This is because it is suitable for high-accuracy processing.

The above-mentioned technique is applied to photomask blanks of the generations aiming at a resist film thickness of 200 nm or less and further at a resist film thickness of 150 nm or less.

The resist, particularly for use in transferring a transfer pattern to the etching mask film, is preferably a resist for electron beam writing. This is because it is suitable for high-accuracy processing.

The above-mentioned technique is applied to a photomask blank for electron beam writing, wherein a resist pattern is formed by electron beam writing.

As a substrate, there can be cited a synthetic quartz substrate, a CaF2 substrate, a soda-lime glass substrate, an alkali-free glass substrate, a low thermal expansion glass substrate, an aluminosilicate glass substrate, or the like.

Photomask blanks include the above-mentioned various phase shift mask blanks and resist-coated mask blanks.

Photomasks include the above-mentioned various phase shift masks. A reticle is included in the photomasks. The phase shift masks include a phase shift mask in which a phase shift part is formed by digging down a substrate.

Hereinbelow, Examples of this invention and Comparative Examples thereof will be described. In each Example, films such as a light-shielding film, an etching mask film, and a phase shift film were formed using a sputtering method as a film forming method and using a DC magnetron sputtering apparatus as a sputtering apparatus. However, for carrying out this invention, a method and apparatus are not particularly limited to such a film forming method and film forming apparatus and use may be made of another type of sputtering apparatus such as an RF magnetron sputtering apparatus.

EXAMPLE 1

Example 1 relates to a method of manufacturing a photomask blank for use in fabricating a phase shift mask of the type having a phase shift part of the substrate dug-down type and further relates to a method of manufacturing the photomask.

[Manufacture of Photomask Blank]

Referring to FIG. 1, a description will be given of photomask blank and photomask manufacturing methods according to Example 1.

First, a substrate made of synthetic quartz was mirror-polished and then cleaned, thereby obtaining a light-transmissive substrate 1 of 6 inches×6 inches×0.25 inches (FIG. 1, (1)).

Then, a light-shielding film 13 for light-shielding part (light-shielding band) formation comprising a CrOCN film (back-surface antireflection layer 11) and a CrON film (light-shielding layer 12) was formed on an upper surface of a light-transmissive substrate 1 (FIG. 1, (1)). Specifically, first, reactive sputtering was carried out in a mixed gas atmosphere of argon (Ar), carbon dioxide ($CO_2$), nitrogen ($N_2$), and helium (He) (Ar:$CO_2$:$N_2$:He=20:25:10:30 [vol %]; pressure: 0.2 [Pa]), thereby forming a CrOCN film having a thickness of 39 nm. Subsequently, reactive sputtering was carried out in a mixed gas atmosphere of argon (Ar), nitrogen monoxide (NO), and helium (He) (Ar:NO:He=15:10:30 [vol %]; pressure: 0.1 [Pa]), thereby forming a CrON film having a thickness of 17 nm on the CrOCN film. The CrOCN film and the CrON film described above were formed using a single-wafer sputtering apparatus.

Then, on the light-shielding film 13, a resist film 50 of a positive resist for laser writing (exposure) (THMR-IP3500: manufactured by Tokyo Ohka Kogyo Co., Ltd.) was applied to a thickness of 465 nm by a spin-coating method (FIG. 1, (1)).

Then, using a laser writing apparatus, a desired pattern was written on the resist film 50 and, thereafter, development was carried out using a predetermined developer, thereby forming a resist pattern 50a (FIG. 1, (2)).

Then, using the resist pattern 50a as a mask, the light-shielding film 13 was dry-etched, thereby forming a light-shielding part (light-shielding band) 13a in the form of a light-shielding film pattern comprising a laminate of a back-surface antireflection layer pattern 11a and a light-shielding layer pattern 12a (FIG. 1, (3)). In this event, a mixed gas of $Cl_2$ and $O_2$ ($Cl_2$:$O_2$=4:1) was used as a dry etching gas.

Then, the remaining resist pattern 50a was stripped and removed by a chemical solution (FIG. 1, (4)).

Then, using a DC magnetron sputtering apparatus, an etching mask film (which will also serve as an antireflection film) 20 was formed on the light-transmissive substrate 1 and further on the light-shielding part (light-shielding band) 13a, thereby fabricating a mask blank (FIG. 1, (5)). Specifically, using a chromium target, reactive sputtering was carried out in a mixed gas atmosphere of argon (Ar), carbon dioxide ($CO_2$), nitrogen ($N_2$), and helium (He) (Ar:$CO_2$:$N_2$:He=20:35:10:30 [vol %]; pressure: 0.2 [Pa]), thereby forming a CrOCN film having a thickness of 14 nm.

The sample at the stage shown at (5) in FIG. 1 corresponds to a mask blank.

Then, on the etching mask film 20, a resist film 51 of a chemically amplified positive resist for electron beam writing (exposure) (PRL009: manufactured by FUJIFILM Electronic Materials Co., Ltd.) was applied to a thickness of 120 nm by the spin-coating method (FIG. 1, (6)).

The sample at the stage shown at (6) in FIG. 1 corresponds to a resist-coated mask blank.

[Manufacture of Photomask]

Then, using an electron beam writing apparatus, a desired pattern was written on the resist film 51 and, thereafter, development was carried out using a predetermined developer, thereby forming a resist pattern 51a (FIG. 1, (7)).

Then, using the resist pattern 51a as a mask, the etching mask film 20 was dry-etched, thereby forming an etching mask film pattern 20a (FIG. 1, (8)). In this event, a mixed gas of $Cl_2$ and $O_2$ ($Cl_2$:$O_2$=4:1) was used as a dry etching gas.

Then, the resist pattern 51a was stripped (FIG. 1, (9)). Then, using the etching mask film pattern 20a as a mask, the light-transmissive substrate 1 was dry-etched with a mixed gas of $CHF_3$ and He, thereby forming a dug-down part 1a on the light-transmissive substrate 1 to obtain a phase shift pattern (phase shift part) of the substrate dug-down type (FIG. 1, (9)). In this event, the light-transmissive substrate 1 was dug down to a depth (about 170 nm) adapted to obtain a phase difference of 180°.

Then, a resist film 52 of a positive resist for laser writing (exposure) (THMR-IP3500: manufactured by Tokyo Ohka Kogyo Co., Ltd.) was applied to a thickness of 465 nm by the spin-coating method and, after writing a desired pattern on the resist film 52 using a laser writing apparatus, development was carried out using a predetermined developer, thereby forming a resist pattern 52a (FIG. 1, (10)). Herein, the resist pattern 52a is formed for the purpose of protecting the light-shielding part (light-shielding band) area.

Then, using the resist pattern 52a as a mask, the etching mask film pattern 20a was stripped by dry etching (FIG. 1, (11)). A mixed gas of $Cl_2$ and $O_2$ ($Cl_2$=4:1) was used as a dry etching gas.

Then, the resist pattern 52a was stripped and then cleaning was carried out, thereby obtaining a photomask 100 (FIG. 1, (12)).

The photomask 100 has a light-shielding part (light-shielding band) 110 in the form of a laminate of the light-shielding film pattern 13a comprising the CrOCN film (back-surface antireflection layer pattern 11a) and the CrON film (light-shielding layer pattern 12a) and the CrOCN film (antireflection film pattern 20a).

[Evaluation]

The photomask thus obtained was evaluated.

As a result, in the photomask according to Example 1, the shift amount of CD (Critical Dimension) of the phase shift pattern (phase shift part) of the substrate dug-down type with respect to CD of the etching mask film pattern 20a was 3.5 nm.

The optical density of the light-shielding part (light-shielding band) 110 for ArF exposure light (wavelength: 193 nm) was OD=3.1 and thus OD≧3 was sufficiently ensured.

Further, with respect to the resolution of the phase shift pattern (phase shift part) of the substrate dug-down type formed on the photomask, it was possible to resolve a phase shift film pattern of 40 nm.

In view of the above, there was obtained the photomask applicable to the DRAM hp45 nm generation and further to the hp32 nm generation.

In the photomask manufacturing processes of Example 1, the resist pattern 50a for forming the light-shielding part (light-shielding band) 13a and the resist pattern 52a for protecting the formed light-shielding part (light-shielding band) were formed using the positive resist for laser writing (exposure) and the laser writing apparatus. However, these resist patterns 50a and 52a may alternatively be formed using a chemically amplified positive resist for electron beam writing (exposure) and an electron beam writing apparatus.

In the photomask manufacturing processes of Example 1, the light-shielding film 13 was dry-etched to form the light-shielding part (light-shielding band) 13a, but may alternatively be wet-etched using an etchant for a Cr-based material.

In the photomask manufacturing processes of Example 1, the resist pattern 51a was stripped after forming the etching mask film pattern 20a (see FIGS. 1, (8) and (9)). This is because when forming the dug-down part 1a on the light-transmissive substrate 1, it is possible to increase the CD accuracy and to reduce the microloading, thus resulting in more excellent processing accuracy as the side wall height of the etching mask film pattern 20a decreases. In the case of forming a photomask that does not require the processing accuracy to that degree, the resist pattern 51a may be stripped after forming the dug-down part 1a.

In the processes shown at (7) and (10) in FIG. 1 of Example 1, the resist patterns 51a and 52a can be formed for the purpose of, if necessary, forming and protecting a zebra pattern for patching the large-area light-shielding part and controlling the transmittance, in addition to the purpose of protecting the light-shielding part (light-shielding band) in the peripheral area of the substrate.

EXAMPLE 2

Example 2 relates to a method of manufacturing a photomask blank for use in fabricating a phase shift mask of the type in which a substrate is not basically dug down and a phase shift part is formed by a halftone phase shift film, and further relates to a method of manufacturing the photomask.

[Manufacture of Photomask Blank]

Referring to FIG. 2, a description will be given of photomask blank and photomask manufacturing methods according to Example 2.

First, a substrate made of synthetic quartz was mirror-polished and then cleaned, thereby obtaining a light-transmissive substrate 1 of 6 inches×6 inches×0.25 inches (FIG. 2, (1)).

Then, using a mixed target of molybdenum (Mo) and silicon (Si) (Mo:Si =1:9 [at %]), reactive sputtering was carried out in a mixed gas atmosphere of argon (Ar) and nitrogen ($N_2$) (Ar:$N_2$=10:90 [vol %]; pressure: 0.3 [Pa]), thereby forming a MoSiN-based light-semitransmissive phase shift film 30 having a thickness of 69 nm on an upper surface of the light-transmissive substrate 1 (FIG. 2, (1)). In this event, the thickness of the phase shift film 30 was adjusted so as to obtain a phase difference of 180°. The transmittance of the phase shift film 30 for ArF exposure light (wavelength: 193 nm) was 6%.

Then, a light-shielding film 13 for light-shielding part (light-shielding band) formation comprising a CrOCN film (back-surface antireflection layer 11) and a CrN film (light-shielding layer 12) was formed on the phase shift film 30 (FIG. 2, (1)). Specifically, first, reactive sputtering was carried out in a mixed gas atmosphere of argon (Ar), carbon dioxide ($CO_2$), nitrogen ($N_2$), and helium (He) (Ar:$CO_2$:$N_2$:He=20:36:5:30 [vol %]; pressure: 0.2 [Pa]), thereby forming a CrOCN film having a thickness of 30 nm. Subsequently, reactive sputtering was carried out in a mixed gas atmosphere of argon (Ar) and nitrogen ($N_2$) (Ar:$N_2$=25:5 [vol %]; pressure: 0.1 [Pa]), thereby forming a CrN film having a thickness of 4 nm on the CrOCN film. The CrOCN film and the CrN film described above were formed using a single-wafer sputtering apparatus.

Then, on the light-shielding film 13, a resist film 50 of a positive resist for laser writing (exposure) (THMR-IP3500: manufactured by Tokyo Ohka Kogyo Co., Ltd.) was applied to a thickness of 465 nm by a spin-coating method (FIG. 2, (1)).

Then, using a laser writing apparatus, a desired pattern was written on the resist film 50 and, thereafter, development was carried out using a predetermined developer, thereby forming a resist pattern 50a (FIG. 2, (2)).

Then, using the resist pattern 50a as a mask, the light-shielding film 13 was dry-etched, thereby forming a light-shielding part (light-shielding band) 13a in the form of a light-shielding film pattern comprising a laminate of a back-surface antireflection layer pattern 11a and a light-shielding layer pattern 12a (FIG. 2, (3)). In this event, a mixed gas of $Cl_2$ and $O_2$ ($Cl_2$:$O_2$=4:1) was used as a dry etching gas.

Then, the remaining resist pattern 50a was stripped and removed by a chemical solution (FIG. 2, (4)).

Then, using a DC magnetron sputtering apparatus, an etching mask film (which will also serve as an antireflection film) 20 was formed on the phase shift film 30 and further on the light-shielding part (light-shielding band) 13a, thereby fabricating a mask blank (FIG. 2, (5)). Specifically, using a chromium target, reactive sputtering was carried out in a mixed gas atmosphere of argon (Ar), carbon dioxide ($CO_2$), nitrogen ($N_2$), and helium (He) (Ar:$CO_2$:$N_2$:He=20:35:10:30 [vol %]; pressure: 0.2 [Pa]), thereby forming a CrOCN film having a thickness of 14 nm.

The sample at the stage shown at (5) in FIG. 2 corresponds to a mask blank.

Then, on the etching mask film 20, a resist film 51 of a chemically amplified positive resist for electron beam writing (exposure) (PRL009: manufactured by FUJIFILM Electronic Materials Co., Ltd.) was applied to a thickness of 120 nm by the spin-coating method (FIG. 2, (6)).

The sample at the stage shown at (6) in FIG. 2 corresponds to a resist-coated mask blank.

[Manufacture of Photomask]

Then, using an electron beam writing apparatus, a desired pattern was written on the resist film 51 and, thereafter, development was carried out using a predetermined developer, thereby forming a resist pattern 51a (FIG. 2, (7)).

Then, using the resist pattern 51a as a mask, the etching mask film 20 was dry-etched, thereby forming an etching mask film pattern 20a (FIG. 2, (8)). In this event, a mixed gas of $Cl_2$ and $O_2$ ($Cl_2$:$O_2$=4:1) was used as a dry etching gas.

Then, the resist pattern 51a was stripped (FIG. 2, (9)). Then, using the etching mask film pattern 20a as a mask, the phase shift film 30 was dry-etched with a mixed gas of SF6 and He, thereby forming a phase shift film pattern 30a (FIG. 2, (9)).

Then, a resist film 52 of a positive resist for laser writing (exposure) (THMR-IP3500: manufactured by Tokyo Ohka Kogyo Co., Ltd.) was applied to a thickness of 465 nm by the spin-coating method and, after writing a desired pattern on the resist film 52 using a laser writing apparatus, development was carried out using a predetermined developer, thereby forming a resist pattern 52a (FIG. 2, (10)). Herein, the resist pattern 52a is formed for the purpose of protecting the light-shielding part (light-shielding band) area.

Then, using the resist pattern 52a as a mask, the etching mask film pattern 20a was stripped by dry etching (FIG. 2, (11)). A mixed gas of $Cl_2$ and $O_2$ ($Cl_2$:$O_2$=4:1) was used as a dry etching gas.

Then, the resist pattern 52a was stripped and then cleaning was carried out, thereby obtaining a photomask 100 (FIG. 2, (12)).

The photomask 100 has a light-shielding part (light-shielding band) 110 in the form of a laminate of the light-shielding film pattern 13a comprising the CrOCN film (back-surface antireflection layer pattern 11a) and the CrN film (light-shielding layer pattern 12a) and the CrOCN film (antireflection film pattern 20a).

[Evaluation]

The photomask thus obtained was evaluated.

As a result, in the photomask according to Example 2, the shift amount of CD (Critical Dimension) of the MoSiN-based halftone phase shift film pattern (phase shift part) 30a with respect to CD of the etching mask film pattern 20a was 3 nm.

The optical density of the light-shielding part (light-shielding band) 110 was OD=3.1 and thus OD≧3 was sufficiently ensured.

Further, with respect to the resolution of the transfer pattern formed on the photomask, it was possible to resolve the MoSiN-based halftone phase shift film pattern 30a of 40 nm.

In view of the above, there was obtained the photomask applicable to the DRAM hp45 nm generation and further to the hp32 nm generation.

In the photomask manufacturing processes of Example 2, the resist pattern 50a for forming the light-shielding part (light-shielding band) 13a and the resist pattern 52a for protecting the formed light-shielding part (light-shielding band) were formed using the positive resist for laser writing (exposure) and the laser writing apparatus. However, these resist patterns 50a and 52a may alternatively be formed using a chemically amplified positive resist for electron beam writing (exposure) and an electron beam writing apparatus.

In the photomask manufacturing processes of Example 2, the light-shielding film 13 was dry-etched to form the light-shielding part (light-shielding band) 13a, but may alternatively be wet-etched using an etchant for a Cr-based material.

In the photomask manufacturing processes of Example 2, the resist pattern 61a was stripped after forming the etching mask film pattern 20a (see FIGS. 2, (8) and (9)). This is because when forming the phase shift film pattern 30a, it is possible to increase the CD accuracy and to reduce the microloading, thus resulting in more excellent processing accuracy as the side wall height of the etching mask film pattern 20a decreases. In the case of forming a photomask that does not require the processing accuracy to that degree, the resist pattern 51a may be stripped after forming the phase shift film pattern 30a.

EXAMPLE 3

Example 3 relates to a method of manufacturing a photomask blank for use in fabricating a phase shift mask of the type having a phase shift part of the substrate dug-down type and further relates to a method of manufacturing the photomask, wherein a light-shielding film is made of a material mainly containing tantalum (Ta).

[Manufacture of Photomask Blank]

Figure 3:
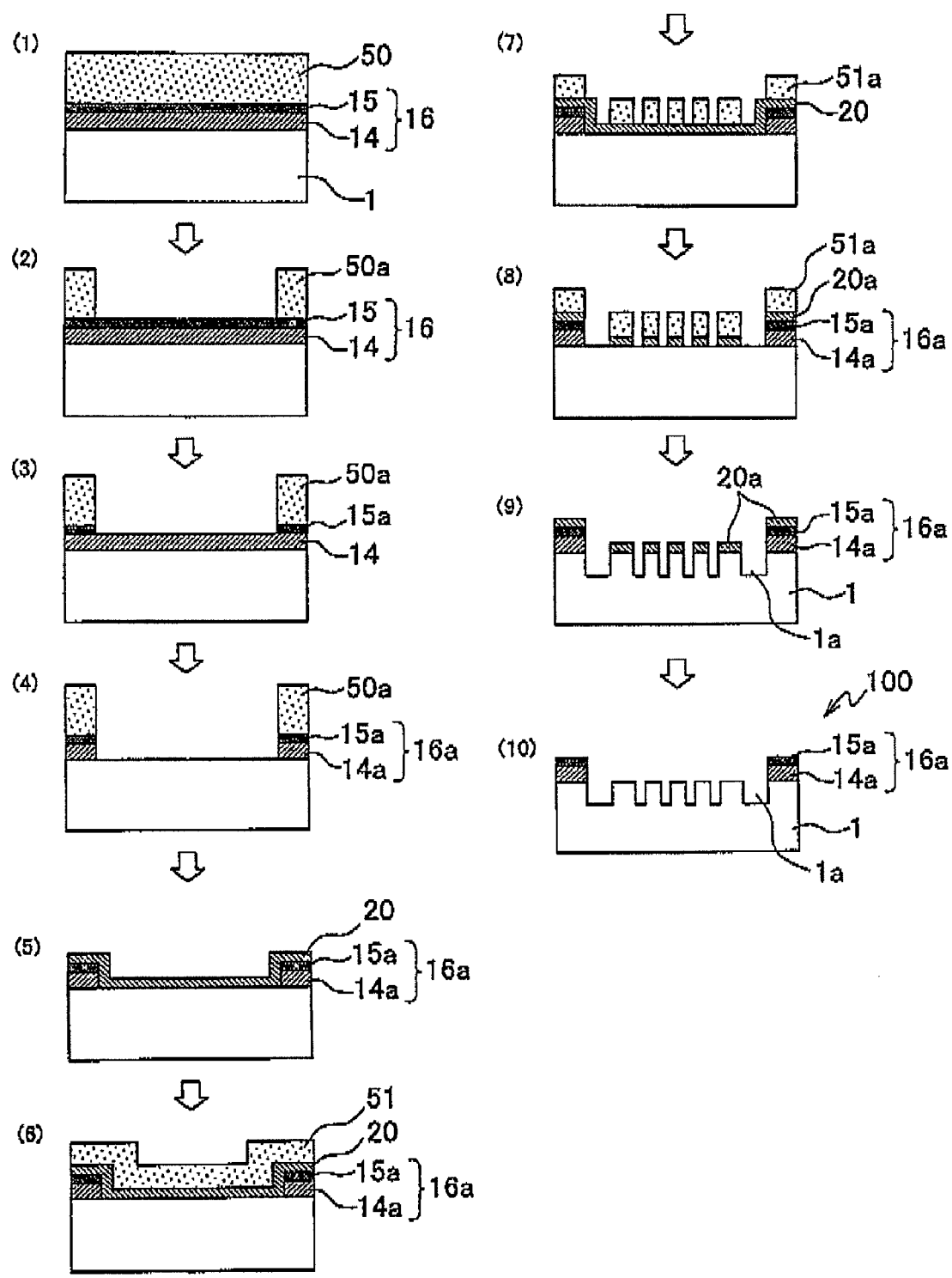
FIG. 3 shows exemplary sectional views for explaining photomask manufacturing processes according to Example 3 of this invention.

Referring to FIG. 3, a description will be given of photomask blank and photomask manufacturing methods according to Example 3.

First, a substrate made of synthetic quartz was mirror-polished and then cleaned, thereby obtaining a light-transmissive substrate 1 of 6 inches×6 inches×0.25 inches (FIG. 3, (1)).

Then, using a DC magnetron sputtering apparatus, a light-shielding film 16 having a two-layer structure in which a tantalum nitride (TaN) layer 14 and a tantalum oxide (TaO) layer 15 were laminated was formed on an upper surface of the light-transmissive substrate 1 (FIG. 3, (1)). Specifically, using a Ta target, a layer of tantalum nitride (TaN) was formed to a thickness of 45 nm under the conditions of introducing gases and flow rates of Xe=11 sccm, $N_2$=15 sccm, and a sputtering power of 1.5 kW. Then, using the same Ta target, a layer of tantalum oxide (TaO) was formed to a thickness of 10 nm under the conditions of introducing gases and flow rates of Ar=58 sccm, $O_2$=32.5 sccm, and a sputtering power of 0.7 kW.

Then, on the light-shielding film 16, a resist film 50 of a positive resist for laser writing (exposure) (THMR-IP3500: manufactured by Tokyo Ohka Kogyo Co., Ltd.) was applied to a thickness of 465 nm by a spin-coating method (FIG. 3, (1)).

Then, using a laser writing apparatus, a desired pattern was written on the resist film 50 and, thereafter, development was carried out using a predetermined developer, thereby forming a resist pattern 50a (FIG. 3, (2)).

Then, using the resist pattern 50a as a mask, the light-shielding film 16 was dry-etched, thereby forming a light-shielding part (light-shielding band) 16a in the form of a light-shielding film pattern comprising a laminate of a tantalum nitride (TaN) layer pattern 14a and a tantalum oxide (TaO) layer pattern 15a (FIG. 3, (3) and (4)). In this event, a mixed gas of $CHF_3$ and He was used as a dry etching gas for the tantalum oxide (TaO) layer 15 and a $Cl_2$ gas was used as a dry etching gas for the tantalum nitride (TaN) layer 14.

Then, the remaining resist pattern 50a was stripped and removed by a chemical solution (FIG. 3, (5)).

Then, using a DC magnetron sputtering apparatus, an etching mask film (which will also serve as an antireflection film) 20 was formed on the light-transmissive substrate 1 and further on the light-shielding part (light-shielding band) 16a, thereby fabricating a mask blank (FIG. 3, (5)). Specifically, using a chromium target, reactive sputtering was carried out in a mixed gas atmosphere of argon (Ar), carbon dioxide ($CO_2$), nitrogen ($N_2$), and helium (He) (Ar:$CO_2$:$N_2$:He=20:35:10:30 [vol %]; pressure: 0.2 [Pa]), thereby forming a CrOCN film having a thickness of 12 nm.

The sample at the stage shown at (5) in FIG. 3 corresponds to a mask blank.

Then, on the etching mask film 20, a resist film 51 of a chemically amplified positive resist for electron beam writing (exposure) (PRL009: manufactured by FUJIFILM Electronic Materials Co., Ltd.) was applied to a thickness of 120 nm by the spin-coating method (FIG. 3, (6)).

The sample at the stage shown at (6) in FIG. 3 corresponds to a resist-coated mask blank.

[Manufacture of Photomask]

Then, using an electron beam writing apparatus, a desired pattern was written on the resist film 51 and, thereafter, development was carried out using a predetermined developer, thereby forming a resist pattern 51a (FIG. 3, (7)).

Then, using the resist pattern 51a as a mask, the etching mask film 20 was dry-etched, thereby forming an etching mask film pattern 20a (FIG. 3, (8)). In this event, a mixed gas of $Cl_2$ and $O_2$ ($Cl_2$:$O_2$=4:1) was used as a dry etching gas.

Then, the resist pattern 51a was stripped (FIG. 3, (9)). Then, using the etching mask film pattern 20a as a mask, the light-transmissive substrate 1 was dry-etched with a mixed gas of $CHF_3$ and He, thereby forming a dug-down part 1a on the light-transmissive substrate 1 to obtain a phase shift pattern (phase shift part) of the substrate dug-down type (FIG. 3, (9)). In this event, the light-transmissive substrate 1 was dug down to a depth (about 170 nm) adapted to obtain a phase difference of 180°.

Then, the etching mask film pattern 20a in the transfer area and outside the transfer area was stripped by dry etching (FIG. 3, (10)). A mixed gas of $Cl_2$ and $O_2$ ($Cl_2$:$O_2$=4:1) was used as a dry etching gas.

Then, cleaning was carried out, thereby obtaining a photomask 100 (FIG. 3, (10)).

The photomask 100 has the light-shielding part (light-shielding band) 16a in the form of the light-shielding film pattern comprising the laminate of the tantalum nitride (TaN) layer pattern 14a and the tantalum oxide (TaO) layer pattern 15a.

[Evaluation]

The photomask thus obtained was evaluated.

As a result, in the photomask according to Example 3, the shift amount of CD (Critical Dimension) of the phase shift pattern (phase shift part) of the substrate dug-down type with respect to CD of the etching mask film pattern 20a was 3.2 nm.

The optical density of the light-shielding part (light-shielding band) 16a was OD=3 or more and thus OD≧3 was sufficiently ensured.

Further, with respect to the resolution of the phase shift pattern (phase shift part) of the substrate dug-down type formed on the photomask, it was possible to resolve a phase shift film pattern of 40 nm.

In view of the above, there was obtained the photomask applicable to the DRAM hp45 nm generation and further to the hp32 nm generation.

In the photomask manufacturing processes of Example 3, the resist pattern 50a for forming the light-shielding part (light-shielding band) 16a was formed using the positive resist for laser writing (exposure) and the laser writing apparatus. However, the resist pattern 50a may alternatively be formed using a chemically amplified positive resist for electron beam writing (exposure) and an electron beam writing apparatus.

In the photomask manufacturing processes of Example 3, the light-shielding film 16 was dry-etched to form the light-shielding part (light-shielding band) 16a, but may alternatively be wet-etched using an etchant for a Cr-based material.

In the photomask manufacturing processes of Example 3, the resist pattern 51a was stripped after forming the etching mask film pattern 20a (see FIGS. 3, (8) and (9)). This is because when forming the dug-down part 1a on the light-transmissive substrate 1, it is possible to increase the CD accuracy and to reduce the microloading, thus resulting in more excellent processing accuracy as the side wall height of the etching mask film pattern 20a decreases. In the case of forming a photomask that does not require the processing accuracy to that degree, the resist pattern 51a may be stripped after forming the dug-down part 1a.

In the process shown at (7) in FIG. 3 of Example 3, the resist pattern 51a can be formed for the purpose of, if necessary, forming and protecting a zebra pattern for patching the large-area light-shielding part and controlling the transmittance, in addition to the purpose of protecting the light-shielding part (light-shielding band) in the peripheral area of the substrate.

EXAMPLE 4

Example 4 relates to a method of manufacturing a photomask blank for use in fabricating a phase shift mask of the type in which a substrate is not basically dug down and a phase shift part is formed by a halftone phase shift film, and further relates to a method of manufacturing the photomask, wherein a light-shielding film is made of a material mainly containing tantalum (Ta).

[Manufacture of Photomask Blank]

Figure 4:
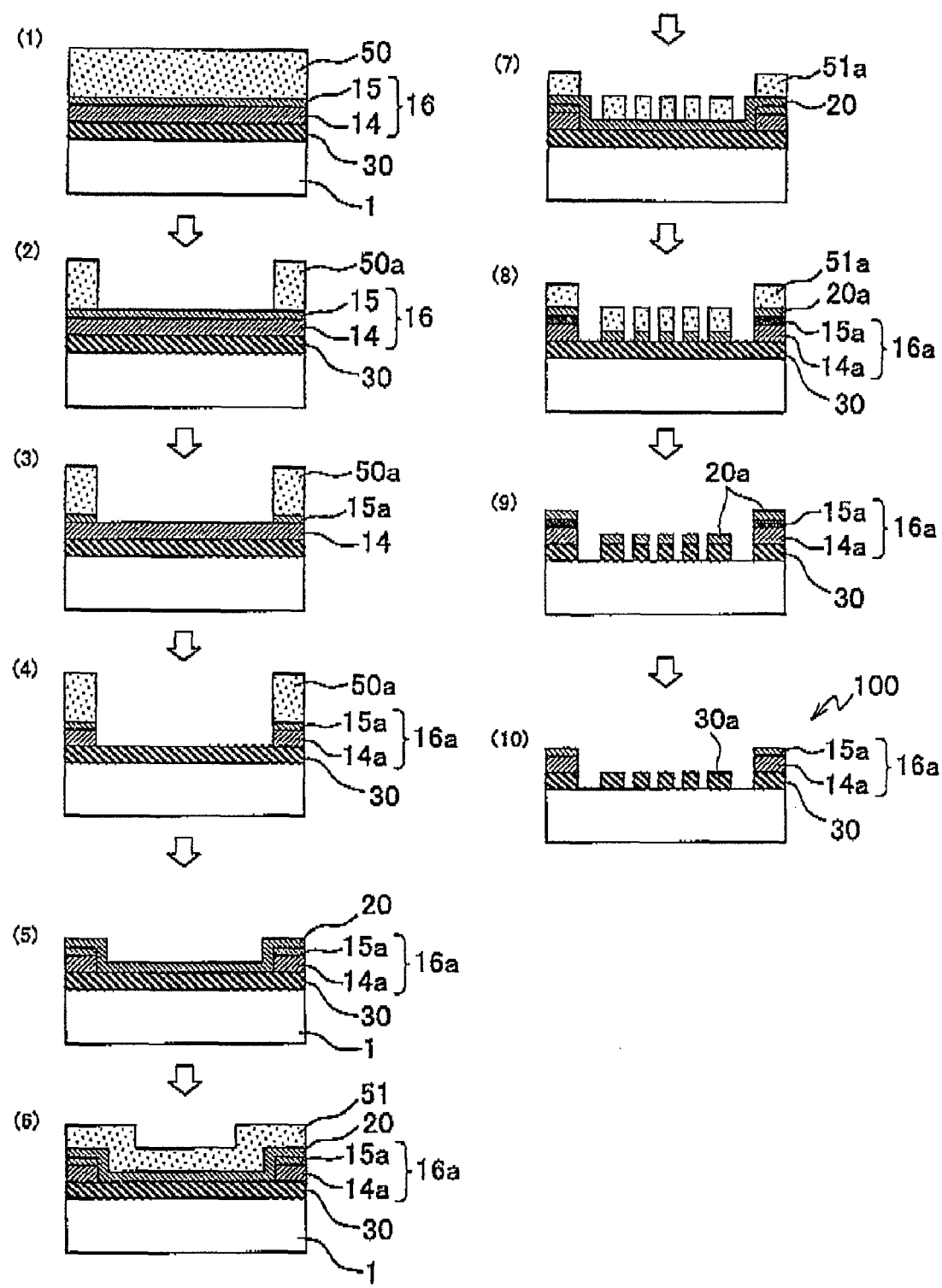
FIG. 4 shows exemplary sectional views for explaining photomask manufacturing processes according to Example 4 of this invention.

Referring to FIG. 4, a description will be given of photomask blank and photomask manufacturing methods according to Example 4.

First, a substrate made of synthetic quartz was mirror-polished and then cleaned, thereby obtaining a light-transmissive substrate 1 of 6 inches×6 inches×0.25 inches (FIG. 4, (1)).

Then, using a mixed target of molybdenum (Mo) and silicon (Si) (Mo:Si =1:9 [at %]), reactive sputtering was carried out in a mixed gas atmosphere of argon (Ar) and nitrogen ($N_2$) (Ar:$N_2$=10:90 [vol %]; pressure: 0.3 [Pa]), thereby forming a MoSiN-based light-semitransmissive phase shift film 30 having a thickness of 69 nm on an upper surface of the light-transmissive substrate 1 (FIG. 4, (1)). In this event, the thickness of the phase shift film 30 was adjusted so as to obtain a phase difference of 180°. The transmittance of the phase shift film 30 for ArF exposure light (wavelength: 193 nm) was 6%.

Then, using a DC magnetron sputtering apparatus, a light-shielding film 16 having a two-layer structure in which a tantalum nitride (TaN) layer 14 and a tantalum oxide (TaO) layer 15 were laminated was formed on the phase shift film 30 (FIG. 4, (1)). Specifically, using a Ta target, a layer of tantalum nitride (TaN) was formed to a thickness of 31 nm under the conditions of introducing gases and flow rates of Xe=11 sccm, $N_2$=15 sccm, and a sputtering power of 1.5 kW. Then, using the same Ta target, a layer of tantalum oxide (TaO) was formed to a thickness of 10 nm under the conditions of introducing gases and flow rates of Ar=58 sccm, $O_2$=32.5 sccm, and a sputtering power of 0.7 kW.

Then, on the light-shielding film 16, a resist film 50 of a positive resist for laser writing (exposure) (THMR-IP3500: manufactured by Tokyo Ohka Kogyo Co., Ltd.) was applied to a thickness of 465 nm by a spin-coating method (FIG. 4, (1)).

Then, using a laser writing apparatus, a desired pattern was written on the resist film 50 and, thereafter, development was carried out using a predetermined developer, thereby forming a resist pattern 50a (FIG. 4, (2)).

Then, using the resist pattern 50a as a mask, the light-shielding film 16 was dry-etched, thereby forming a light-shielding part (light-shielding band) 6a in the form of a light-shielding film pattern comprising a laminate of a tantalum nitride (TaN) layer pattern 14a and a tantalum oxide (TaO) layer pattern 15a (FIG. 4, (3) and (4)). In this event, a mixed gas of $CHF_3$ and He was used as a dry etching gas for the tantalum oxide (TaO) layer 15 and a $Cl_2$ gas was used as a dry etching gas for the tantalum nitride (TaN) layer 14.

Then, the remaining resist pattern 50a was stripped and removed by a chemical solution (FIG. 4, (5)).

Then, using a DC magnetron sputtering apparatus, an etching mask film (which will also serve as an antireflection film) 20 was formed on the phase shift film 30 and further on the light-shielding part (light-shielding band) 16a, thereby fabricating a mask blank (FIG. 4, (5)). Specifically, using a chromium target, reactive sputtering was carried out in a mixed gas atmosphere of argon (Ar), carbon dioxide ($CO_2$), nitrogen ($N_2$), and helium (He) (Ar:$CO_2$:$N_2$:He=20:35; 10:30 [vol %]; pressure: 0.2 [Pa]), thereby forming a CrOCN film having a thickness of 10 nm.

The sample at the stage shown at (5) in FIG. 4 corresponds to a mask blank.

Then, on the etching mask film 20, a resist film 51 of a chemically amplified positive resist for electron beam writing (exposure) (PRL009: manufactured by FUJIFILM Electronic Materials Co., Ltd.) was applied to a thickness of 120 nm by the spin-coating method (FIG. 4, (6)).

The sample at the stage shown at (6) in FIG. 4 corresponds to a resist-coated mask blank.

[Manufacture of Photomask]

Then, using an electron beam writing apparatus, a desired pattern was written on the resist film 51 and, thereafter, development was carried out using a predetermined developer, thereby forming a resist pattern 51a (FIG. 4, (7)).

Then, using the resist pattern 51a as a mask, the etching mask film 20 was dry-etched, thereby forming an etching mask film pattern 20a (FIG. 4, (8)). In this event, a mixed gas of $Cl_2$ and $O_2$ ($Cl_2:O_2=4:1$) was used as a dry etching gas.

Then, the resist pattern 51a was stripped (FIG. 4, (9)). Then, using the etching mask film pattern 20a as a mask, the phase shift film 30 was dry-etched with a mixed gas of SF6 and He, thereby forming a phase shift film pattern 30a (FIG. 4, (9)).

Then, the etching mask film pattern 20a in the transfer area and outside the transfer area was stripped by dry etching (FIG. 4, (10)). A mixed gas of $Cl_2$ and $O_2$ ($Cl_2:O_2=4:1$) was used as a dry etching gas.

Then, cleaning was carried out, thereby obtaining a photomask 100 (FIG. 4, (10)).

The photomask 100 has the light-shielding part (light-shielding band) 16a in the form of the light-shielding film pattern comprising the laminate of the tantalum nitride (TaN) layer pattern 14a and the tantalum oxide (TaO) layer pattern 15a.

[Evaluation]

The photomask thus obtained was evaluated.

As a result, in the photomask according to Example 4, the shift amount of CD (Critical Dimension) of the MoSiN-based halftone phase shift film pattern (phase shift part) 30a with respect to CD of the etching mask film pattern 20a was 3 nm.

The optical density of the light-shielding part (light-shielding band) 16a was OD=3.1 and thus OD≧3 was sufficiently ensured.

Further, with respect to the resolution of the transfer pattern formed on the photomask, it was possible to resolve the MoSiN-based halftone phase shift film pattern 30a of 40 nm.

In view of the above, there was obtained the photomask applicable to the DRAM hp45 nm generation and further to the hp32 nm generation.

In the photomask manufacturing processes of Example 4, the resist pattern 50a for forming the light-shielding part (light-shielding band) 16a was formed using the positive resist for laser writing (exposure) and the laser writing apparatus. However, the resist pattern 50a may alternatively be formed using a chemically amplified positive resist for electron beam writing (exposure) and an electron beam writing apparatus.

In the photomask manufacturing processes of Example 4, the light-shielding film 16 was dry-etched to form the light-shielding part (light-shielding band) 16a, but may alternatively be wet-etched using an etchant for a Cr-based material.

In the photomask manufacturing processes of Example 4, the resist pattern 51a was stripped after forming the etching mask film pattern 20a (see FIGS. 4, (8) and (9)). This is because when forming the phase shift film pattern 30a, it is possible to increase the CD accuracy and to reduce the microloading, thus resulting in more excellent processing accuracy as the side wall height of the etching mask film pattern 20a decreases. In the case of forming a photomask that does not require the processing accuracy to that degree, the resist pattern 51a may be stripped after forming the phase shift film pattern 30a.

EXAMPLE 5

Example 5 relates to a method of manufacturing a photomask blank for use in fabricating a phase shift mask of the type in which a high-transmittance phase shift part is formed by providing a halftone phase shift film and further by digging down a substrate, and further relates to a method of manufacturing the photomask.

[Manufacture of Photomask Blank]

Referring to FIG. 5, a description will be given of photomask blank and photomask manufacturing methods according to Example 5.

First, a substrate made of synthetic quartz was mirror-polished and then cleaned, thereby obtaining a light-transmissive substrate 1 of 6 inches×6 inches×0.25 inches (FIG. 5, (1)).

Then, using a mixed target of molybdenum (Mo) and silicon (Si) (Mo:Si =1:9 [at %]), reactive sputtering was carried out in a mixed gas atmosphere of argon (Ar) and nitrogen ($N_2$) ($Ar:N_2=10:90$ [vol %]; pressure: 0.3 [Pa]), thereby forming a MoSiN-based light-semitransmissive phase shift film 31 having a thickness of 38 nm on an upper surface of the light-transmissive substrate 1 (FIG. 5, (1)). In this event, the thickness of the phase shift film 31 was adjusted so that the transmittance of the phase shift film 31 for ArF exposure light (wavelength: 193 nm) was 20%.

Then, a light-shielding film 13 for light-shielding part (light-shielding band) formation comprising a CrOCN film (back-surface antireflection layer 11) and a CrN film (light-shielding layer 12) was formed on the phase shift film 31 (FIG. 5, (1)). Specifically, first, reactive sputtering was carried out in a mixed gas atmosphere of argon (Ar), carbon dioxide ($CO_2$), nitrogen ($N_2$), and helium (He) ($Ar:CO_2:N_2:He=20:35:5:30$ [vol %]; pressure: 0.2 [Pa]), thereby forming a CrOCN film having a thickness of 30 nm. Subsequently, reactive sputtering was carried out in a mixed gas atmosphere of argon (Ar) and nitrogen ($N_2$) ($Ar:N_2=25:5$ [vol %]; pressure: 0.1 [Pa]), thereby forming a CrN film having a thickness of 4 nm on the CrOCN film. The CrOCN film and the CrN film described above were formed using a single-wafer sputtering apparatus.

Then, on the light-shielding film 13, a resist film 50 of a positive resist for laser writing (exposure) (THMR-IP3500: manufactured by Tokyo Ohka Kogyo Co., Ltd.) was applied to a thickness of 465 nm by a spin-coating method (FIG. 5, (1)).

Then, using a laser writing apparatus, a desired pattern was written on the resist film 50 and, thereafter, development was carried out using a predetermined developer, thereby forming a resist pattern 50a (FIG. 5, (2)).

Then, using the resist pattern 50a as a mask, the light-shielding film 13 was dry-etched, thereby forming a light-shielding part (light-shielding band) 13a in the form of a light-shielding film pattern comprising a laminate of a back-surface antireflection layer pattern 11a and a light-shielding layer pattern 12a (FIG. 5, (3)). In this event, a mixed gas of $Cl_2$ and $O_2$ ($Cl_2:O_2=4:1$) was used as a dry etching gas.

Then, the remaining resist pattern 60a was stripped and removed by a chemical solution (FIG. 5, (4)).

Then, using a DC magnetron sputtering apparatus, an etching mask film (which will also serve as an antireflection film) 20 was formed on the phase shift film 31 and further on the light-shielding part (light-shielding band) 13a, thereby fabricating a mask blank (FIG. 5, (5)), Specifically, using a chromium target, reactive sputtering was carried out in a mixed gas atmosphere of argon (Ar), carbon dioxide ($CO_2$), nitrogen ($N_2$), and helium (He) ($Ar:CO_2:N_2:He=20:35:10:30$ [vol %]; pressure: 0.2 [Pa])), thereby forming a CrOCN film having a thickness of 14 nm.

The sample at the stage shown at (5) in FIG. 5 corresponds to a mask blank.

Then, on the etching mask film 20, a resist film 51 of a chemically amplified positive resist for electron beam writing (exposure) (PRL009: manufactured by FUJIFILM Electronic Materials Co., Ltd.) was applied to a thickness of 120 nm by the spin-coating method (FIG. 5, (6)).

The sample at the stage shown at (6) in FIG. 5 corresponds to a resist-coated mask blank.

[Manufacture of Photomask]

Then, using an electron beam writing apparatus, a desired pattern was written on the resist film 51 and, thereafter, development was carried out using a predetermined developer, thereby forming a resist pattern 51a (FIG. 5, (7)).

Then, using the resist pattern 51a as a mask, the etching mask film 20 was dry-etched, thereby forming an etching mask film pattern 20a (FIG. 5, (8)). In this event, a mixed gas of $Cl_2$ and $O_2$ ($Cl_2:O_2=4:1$) was used as a dry etching gas.

Then, the resist pattern 51a was stripped (FIG. 5, (9)). Then, using the etching mask film pattern 20a as a mask, the phase shift film 31 and the light-transmissive substrate 1 were dry-etched in order using a mixed gas of $CHF_3$ and He, thereby forming a phase shift film pattern 31a and a dug-down part 1a on the light-transmissive substrate 1 to obtain a phase shift pattern (phase shift part) (FIG. 5, (9)), In this event, the light-transmissive substrate 1 was dug down to a depth adapted to obtain a phase difference of 180° as the sum of phase differences produced by the phase shift film pattern 31a and the dug-down part 1a of the light-transmissive substrate 1 (specifically, a depth of 76 nm).

Then, a resist film 52 of a positive resist for laser writing (exposure) (THMR-IP3500: manufactured by Tokyo Ohka Kogyo Co., Ltd.) was applied to a thickness of 465 nm by the spin-coating method and, after writing a desired pattern on the resist film 52 using a laser writing apparatus, development was carried out using a predetermined developer, thereby forming a resist pattern 52a (FIG. 5, (10)). Herein, the resist pattern 52a is formed for the purpose of protecting the light-shielding part (light-shielding band) area.

Then, using the resist pattern 52a as a mask, the etching mask film pattern 20a was stripped by dry etching (FIG. 5, (11)). A mixed gas of $Cl_2$ and $O_2$ ($Cl_2:O_2=4:1$) was used as a dry etching gas.

Then, the resist pattern 52a was stripped and then cleaning was carried out, thereby obtaining a photomask 100 (FIG. 5, (12)).

The photomask 100 has a light-shielding part (light-shielding band) 110 in the form of a laminate of the light-shielding film pattern 13a comprising the CrOCN film (back-surface antireflection layer pattern 11a) and the CrN film (light-shielding layer pattern 12a) and the CrOCN film (antireflection film pattern 20a).

[Evaluation]

The photomask thus obtained was evaluated.

As a result, in the photomask according to Example 5, the shift amount of CD (Critical Dimension) of the phase shift film pattern 31a and the phase shift pattern (phase shift part) of the substrate dug-down type with respect to CD of the etching mask film pattern 20a was 3.5 nm.

The optical density of the light-shielding part (light-shielding band) 110 was OD=3.5 or more and thus OD≧3 was sufficiently ensured.

Further, with respect to the resolution of the phase shift pattern (phase shift part) of the substrate dug-down type formed on the photomask, it was possible to resolve a phase shift film pattern of 40 nm.

In view of the above, there was obtained the photomask applicable to the DRAM hp45 nm generation and further to the hp32 nm generation.

In the photomask manufacturing processes of Example 5, the resist pattern 50a for forming the light-shielding part (light-shielding band) 13a and the resist pattern 52a for protecting the formed light-shielding part (light-shielding band) were formed using the positive resist for laser writing (exposure) and the laser writing apparatus. However, these resist patterns 50a and 52a may alternatively be formed using a chemically amplified positive resist for electron beam writing (exposure) and an electron beam writing apparatus.

In the photomask manufacturing processes of Example 5, the light-shielding film 13 was dry-etched to form the light-shielding part (light-shielding band) 13a, but may alternatively be wet-etched using an etchant for a Cr-based material.

In the photomask manufacturing processes of Example 5, the resist pattern 51a was stripped after forming the etching mask film pattern 20a (see FIGS. 5, (8) and (9)). This is because when forming the dug-down part in on the light-transmissive substrate 1, it is possible to increase the CD accuracy and to reduce the microloading, thus resulting in more excellent processing accuracy as the side wall height of the etching mask film pattern 20a decreases. In the case of forming a photomask that does not require the processing accuracy to that degree, the resist pattern 51a may be stripped after forming the dug-down part 1a.

In the processes shown at (7) and (10) in FIG. 5 of Example 5, the resist patterns 51a and 52a can be formed for the purpose of, if necessary, forming and protecting a zebra pattern for patching the large-area light-shielding part and controlling the transmittance, in addition to the purpose of protecting the light-shielding part (light-shielding band) in the peripheral area of the substrate.

EXAMPLE 6

Example 6 relates to a method of manufacturing a photomask blank for use in fabricating a phase shift mask of the type in which a substrate is not dug down and a high-transmittance phase shift part is formed by providing a high-transmittance halftone phase shift film, and further relates to a method of manufacturing the photomask.

[Manufacture of Photomask Blank]

Referring to FIG. 6, a description will be given of photomask blank and photomask manufacturing methods according to Example 6.

First, a substrate made of synthetic quartz was mirror-polished and then cleaned, thereby obtaining a light-transmissive substrate 1 of 6 inches×6 inches×0.25 inches (FIG. 6, (1)).

Then, using a DC magnetron sputtering apparatus, a high-transmittance halftone phase shift film 34 in the form of a laminated film comprising a transmittance adjusting layer 32 made of TaHf and a phase adjusting layer 33 made of SiON was formed on an upper surface of the light-transmissive substrate 1. Specifically, using a target of Ta:Hf=80:20 (at % ratio) and using Ar as a sputtering gas, the layer 32 made of tantalum and hafnium (TaHf layer:at % ratio of Ta and Hf in the layer was about 80:20) was formed to a thickness of 12 nm aid, then, using a Si target, reactive sputtering was carried out in a mixed gas atmosphere of argon (Ar), nitrogen ($N_2$), and oxygen ($O_2$) ($ArN_2:O_2=20:57:23$ [vol %]), thereby forming the SiON layer 33 having a thickness of 112 nm (FIG. 6, (1)). In this event, the thicknesses of the respective layers were adjusted to cause the phase shift film 34 to produce a phase difference of 180° for ArF exposure light (wavelength: 193 nm). The transmittance of the phase shift film 34 for ArF exposure light (wavelength: 193 nm) was 20%, i.e. a high transmittance.

Then, a light-shielding film 13 for light-shielding part (light-shielding band) formation comprising a CrOCN film (back-surface antireflection layer 11) and a CrN film (light-shielding layer 12) was formed on the phase shift film 34 (FIG. 6, (1)). Specifically, first, reactive sputtering was carried out in a mixed gas atmosphere of argon (Ar), carbon dioxide ($CO_2$), nitrogen ($N_2$), and helium (He) (Ar:$CO_2$:$N_2$:He=20:35:5:30 [vol %]; pressure: 0.2 [Pa]), thereby forming a CrOCN film having a thickness of 30 nm, Subsequently, reactive sputtering was carried out in a mixed gas atmosphere of argon (Ar) and nitrogen ($N_2$) (Ar:$N_2$=25:5 [vol %]; pressure: 0.1 [Pa]), thereby forming a CrN film having a thickness of 4 nm on the CrOCN film. The CrOCN film and the CrN film described above were formed using a single-wafer sputtering apparatus.

Then, on the light-shielding film 13, a resist film 50 of a positive resist for laser writing (exposure) (THMR-IP3500: manufactured by Tokyo Ohka Kogyo Co., Ltd.) was applied to a thickness of 465 nm by a spin-coating method (FIG. 6, (1)).

Then, using a laser writing apparatus, a desired pattern was written on the resist film 50 and, thereafter, development was carried out using a predetermined developer, thereby forming a resist pattern 50a (FIG. 6, (2)).

Then, using the resist pattern 50a as a mask, the light-shielding film 13 was dry-etched, thereby forming a light-shielding part (light-shielding band) 13a in the form of a light-shielding film pattern comprising a laminate of a back-surface antireflection layer pattern 11a and a light-shielding layer pattern 12a (FIG. 6, (3)). In this event, a mixed gas of $Cl_2$ and $O_2$ ($Cl_2$:$O_2$=4:1) was used as a dry etching gas.

Then, the remaining resist pattern 50a was stripped and removed by a chemical solution (FIG. 6, (4)).

Then, using a DC magnetron sputtering apparatus, an etching mask film (which will also serve as an antireflection film) 20 was formed on the phase shift film 34 and further on the light-shielding part (light-shielding band) 13a, thereby fabricating a mask blank (FIG. 6, (5)). Specifically, using a chromium target, reactive sputtering was carried out in a mixed gas atmosphere of argon (Ar), carbon dioxide ($CO_2$), nitrogen ($N_2$), and helium (He) (Ar:$CO_2$:$N_2$:He=20:35:10:30 [vol %]; pressure: 0.2 [Pa]), thereby forming a CrOCN film having a thickness of 14 nm.

The sample at the stage shown at (5) in FIG. 6 corresponds to a mask blank.

Then, on the etching mask film 20, a resist film 51 of a chemically amplified positive resist for electron beam writing (exposure) (PRL009: manufactured by FUJIFILM Electronic Materials Co., Ltd.) was applied to a thickness of 120 nm by the spin-coating method (FIG. 6, (6)).

The sample at the stage shown at (6) in FIG. 6 corresponds to a resist-coated mask blank.

[Manufacture of Photomask]

Then, using an electron beam writing apparatus, a desired pattern was written on the resist film 51 and, thereafter, development was carried out using a predetermined developer, thereby forming a resist pattern 51a (FIG. 6, (7)).

Then, using the resist pattern 51a as a mask, the etching mask film 20 was dry-etched, thereby forming an etching mask film pattern 20a (FIG. 6, (8)). In this event, a mixed gas of $Cl_2$ and $O_2$ ($Cl_2$:$O_2$=4:1) was used as a dry etching gas.

Then, the resist pattern 51a was stripped (FIG. 6, (9)). Then, using the etching mask film pattern 20a as a mask, the phase adjusting layer 33 made of SiON was dry-etched with a mixed gas of SF6 and He, thereby forming a phase adjusting layer pattern 33a (FIG. 6, (9)). Further, using the etching mask film pattern 20a and so on as a mask, the transmittance adjusting layer 32 made of TaHf was dry-etched with a $Cl_2$ gas, thereby forming a transmittance adjusting layer pattern 32a (FIG. 6, (9)). Consequently, there was formed a phase shift film pattern 34a comprising the phase adjusting layer pattern 33a and the transmittance adjusting layer pattern 32a (FIG. 6, (9)).

Then, a resist film 52 of a positive resist for laser writing (exposure) (THMR-IP3500: manufactured by Tokyo Ohka Kogyo Co., Ltd.) was applied to a thickness of 465 nm by the spin-coating method and, after writing a desired pattern on the resist film 52 using a laser writing apparatus, development was carried out using a predetermined developer, thereby forming a resist pattern 52a (FIG. 6, (10)). Herein, the resist pattern 52a is formed for the purpose of protecting the light-shielding part (light-shielding band) area.

Then, using the resist pattern 52a as a mask, the etching mask film pattern 20a was stripped by dry etching (FIG. 6, (11)). A mixed gas of $Cl_2$ and $O_2$ ($Cl_2$:$O_2$=4:1) was used as a dry etching gas.

Then, the resist pattern 52a was stripped and then cleaning was carried out, thereby obtaining a photomask 100 (FIG. 6, (12)).

The photomask 100 has a light-shielding part (light-shielding band) 110 in the form of a laminate of the light-shielding film pattern 13a comprising the CrOCN film (back-surface antireflection layer pattern 11a) and the CrN film (light-shielding layer pattern 12a) and the CrOCN film (antireflection film pattern 20a).

[Evaluation]

The photomask thus obtained was evaluated.

As a result, in the photomask according to Example 6, the shift amount of OD (Critical Dimension) of the halftone phase shift film pattern (phase shift part) 34a with respect to CD of the etching mask film pattern 20a was 3 nm.

The optical density of the light-shielding part (light-shielding band) 110 was OD=3.1 and thus OD≧3 was sufficiently ensured.

Further, with respect to the resolution of the transfer pattern formed on the photomask, it was possible to resolve the halftone phase shift film pattern 34a of 40 nm.

In view of the above, there was obtained the photomask applicable to the DRAM hp45 nm generation and further to the hp32 nm generation.

In the photomask manufacturing processes of Example 6, the resist pattern 50a for forming the light-shielding part (light-shielding band) 13a and the resist pattern 52a for protecting the formed light-shielding part (light-shielding band) were formed using the positive resist for laser writing (exposure) and the laser writing apparatus. However, these resist patterns 50a and 52a may alternatively be formed using a chemically amplified positive resist for electron beam writing (exposure) and an electron beam writing apparatus.

In the photomask manufacturing processes of Example 6, the light-shielding film 13 was dry-etched to form the light-shielding part (light-shielding band) 13a, but may alternatively be wet-etched using an etchant for a Cr-based material.

In the photomask manufacturing processes of Example 6, the resist pattern 51a was stripped after forming the etching mask film pattern 20a (see FIGS. 6, (8) and (9)). This is because when forming the phase shift film pattern 34a, it is possible to increase the CD accuracy and to reduce the microloading, thus resulting in more excellent processing accuracy as the side wall height of the etching mask film pattern 20a decreases. In the case of forming a photomask that does not require the processing accuracy to that degree, the resist pattern 51a may be stripped after forming the phase shift film pattern 34a.

COMPARATIVE EXAMPLE 1

Comparative Example 1 relates to a method of manufacturing a photomask blank for use in fabricating a phase shift mask of the type having a phase shift part of the substrate dug-down type and further relates to a method of manufacturing the photomask.

Figure 7:
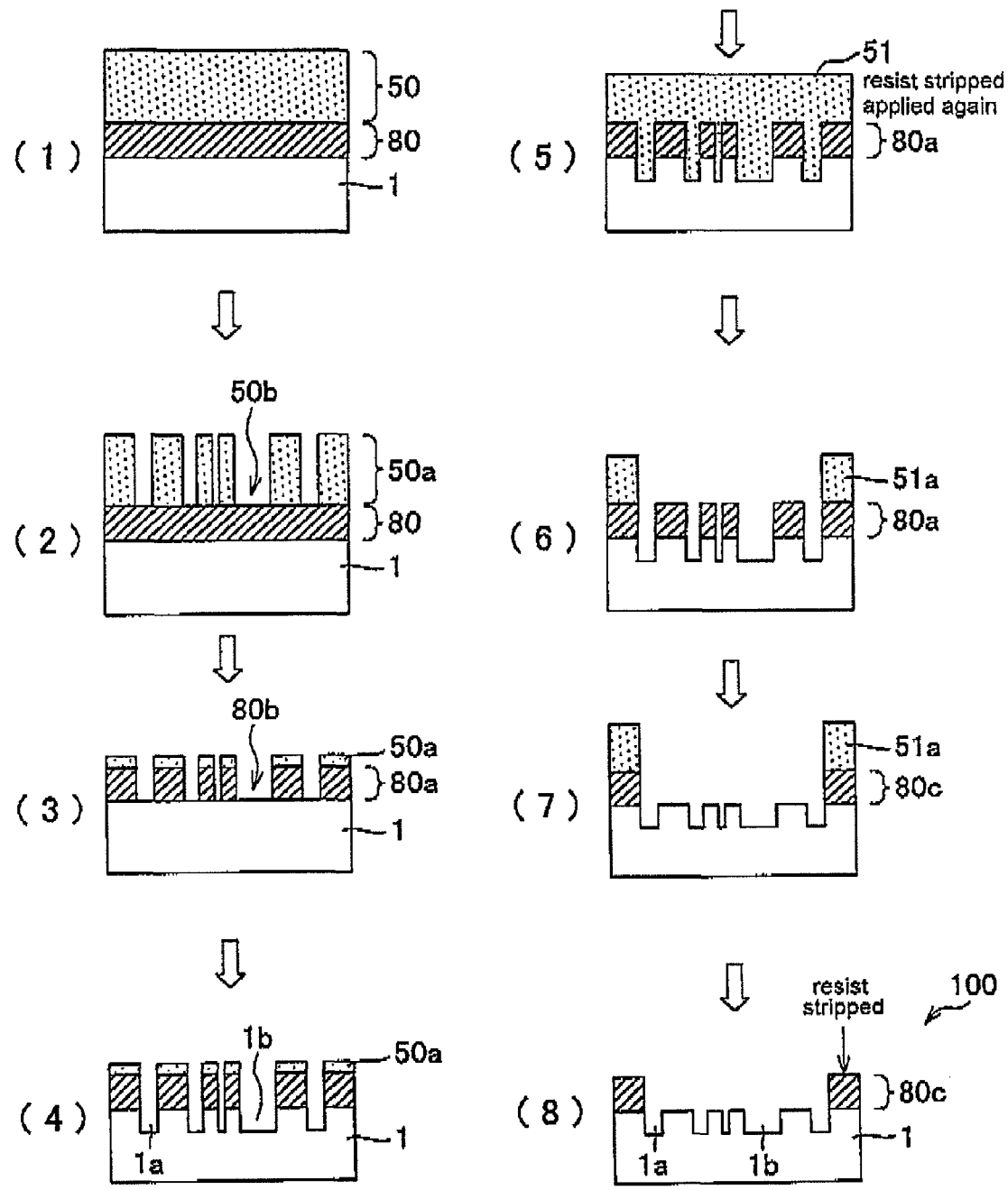
FIG. 7 shows exemplary sectional views for explaining photomask manufacturing processes according to Comparative Example 1.

In FIG. 7, (1) shows one example of a photomask blank according to Comparative Example 1. This photomask blank has, on a light-transmissive substrate 1, a light-shielding film 80 being a layer serving as an etching mask film and also adapted for forming a light-shielding part (light-shielding band).

[Manufacture of Photomask Blank]

Referring to FIG. 7, a description will be given of photomask blank and photomask manufacturing methods according to Comparative Example 1.

A light-shielding film 80 for light-shielding band formation serving also as an etching mask film and comprising a CrN layer, a CrC layer, and a CrON layer was formed on an upper surface of a light-transmissive substrate 1 using an in-line type sputtering apparatus in which a plurality of chromium (Cr) targets were disposed in a chamber (FIG. 7, (1)).

Specifically, first, reactive sputtering was carried out in a mixed gas atmosphere of argon (Ar) and nitrogen ($N_2$) (Ar:$N_2$=72:28 [vol %]; pressure: 0.3 [Pa]), thereby forming a CrN layer. Subsequently, reactive sputtering was carried out in a mixed gas atmosphere of argon (Ar) and methane ($CH_4$) (Ar:$CH_4$=96.5:3.5 [vol %]; pressure: 0.3 [Pa]), thereby forming a CrC layer. Subsequently, reactive sputtering was carried out in a mixed gas atmosphere of argon (Ar) and nitrogen monoxide (NO) (Ar:NO=87.5:12.5 [vol %]; pressure: 0.3 [Pa]), thereby forming a CrON layer on the CrC layer. The light-shielding film 80 in the form of the three-layer laminated film was continuously formed using the in-line type sputtering apparatus and thus configured such that the components thereof continuously changed in a thickness direction thereof. The total thickness of the light-shielding film 80 was 73 nm. The light-shielding film 80 exhibited an OD of 3.5 or more for ArF exposure light (wavelength: 193 nm).

[Manufacture of Photomask]

Then, as shown at (1) in FIG. 7, a resist film 50 of a chemically amplified positive resist for electron beam writing (exposure) (PRL009: manufactured by FUJIFILM Electronic Materials Co., Ltd.) was applied to a thickness of 300 nm on the light-shielding film 80 by a spin-coating method.

Then, using an electron beam writing apparatus, a desired pattern (50 nm-resolution pattern adapted to the hp45 nm generation) was written on the resist film 50 and, thereafter, development was carried out using a predetermined developer, thereby forming a resist pattern 50a (FIG. 7, (2)).

Then, using the resist pattern 50a as a mask, the light-shielding film 80 was dry-etched, thereby forming a light-shielding film pattern 80a (FIG. 7, (3)). In this event, a mixed gas of $Cl_2$ and $O_2$ ($Cl_2$:$O_2$=4:1) was used as a dry etching gas.

Then, using the resist pattern 50a and the light-shielding film pattern 80a as a mask, the light-transmissive substrate 1 was dry-etched with a mixed gas of $CHF_3$ and He, thereby obtaining a phase shift pattern (phase shift part) of the substrate dug-down type (FIG. 7, (4)). In this event, the light-transmissive substrate 1 was etched to a depth adapted to obtain a phase difference of 180° for ArF exposure light (193 nm) (specifically, a depth of 170 nm), thereby forming a dug-down part 1a on the light-transmissive substrate 1 to provide the phase shift pattern (phase shift part).

Then, the resist pattern 50a was stripped and then a resist film 51 of a positive resist for laser writing (exposure) (THMR-IP3500: manufactured by Tokyo Ohka Kogyo Co., Ltd.) was applied to a thickness of 465 nm on the light-shielding film pattern 80a by the spin-coating method (FIG. 7, (5)).

Then, using a laser writing apparatus, a light-shielding part (light-shielding band) pattern was written on the resist film 51 and then developed with a predetermined developer, thereby forming a resist pattern 51a (FIG. 7, (6)). Then, using the resist pattern 51a as a mask, the light-shielding film pattern 80a was dry-etched with a mixed gas of $Cl_2$ and $O_2$ ($Cl_2$:$O_2$=4:1), thereby forming a light-shielding part (light-shielding band) 80c (FIG. 7, (7)).

Then, the resist pattern 51a was stripped and then cleaning was carried out, thereby obtaining a photomask 100 having the light-shielding part (light-shielding band) 80c on the light-transmissive substrate 1 (FIG. 7, (8)).

[Evaluation]

The photomask thus obtained was evaluated.

As a result, in the photomask according to Comparative Example 1, a pattern error part 1b occurred at a portion of the phase shift pattern (phase shift part) of the substrate dug-down type. This is caused by the fact that resist collapse and resist stripping occurred during development due to a high aspect ratio (ratio of the resist height to the resist width) of the resist pattern 50a at a fine-line pattern portion, leading to the occurrence of a stripped part 50b. Thus, a pattern defective part 80b occurred in the light-shielding film pattern 80a and, as a result of dry-etching the substrate 1 using the light-shielding film pattern 80a as an etching mask pattern, the pattern error part 1b was dug down, Further, since the thickness of the light-shielding film pattern 80a serving also as an etching mask pattern was as thick as 73 nm, there occurred a portion where the digging depth of the phase shift pattern 1a was not enough to produce the phase shift effect. In view of the above, with respect to the resolution of the phase shift pattern (phase shift part) of the substrate dug-down type formed on the photomask, it was found that the resolution of the phase shift film pattern was difficult.

The optical density of the light-shielding part (light-shielding band) 80c was OD=3.5 or more and thus OD≧3 was sufficiently ensured.

Consequently, it was found that, with the photomask blank of Comparative Example 1, it was difficult to obtain a photomask suitable for the DRAM hp45 nm generation and further the hp32 nm generation.

COMPARATIVE EXAMPLE 2

Comparative Example 2 relates to a method of manufacturing a photomask blank for use in fabricating a phase shift mask of the type in which a substrate is not basically dug down and a phase shift part is formed by a halftone phase shift film, and further relates to a method of manufacturing the photomask.

Figure 8:
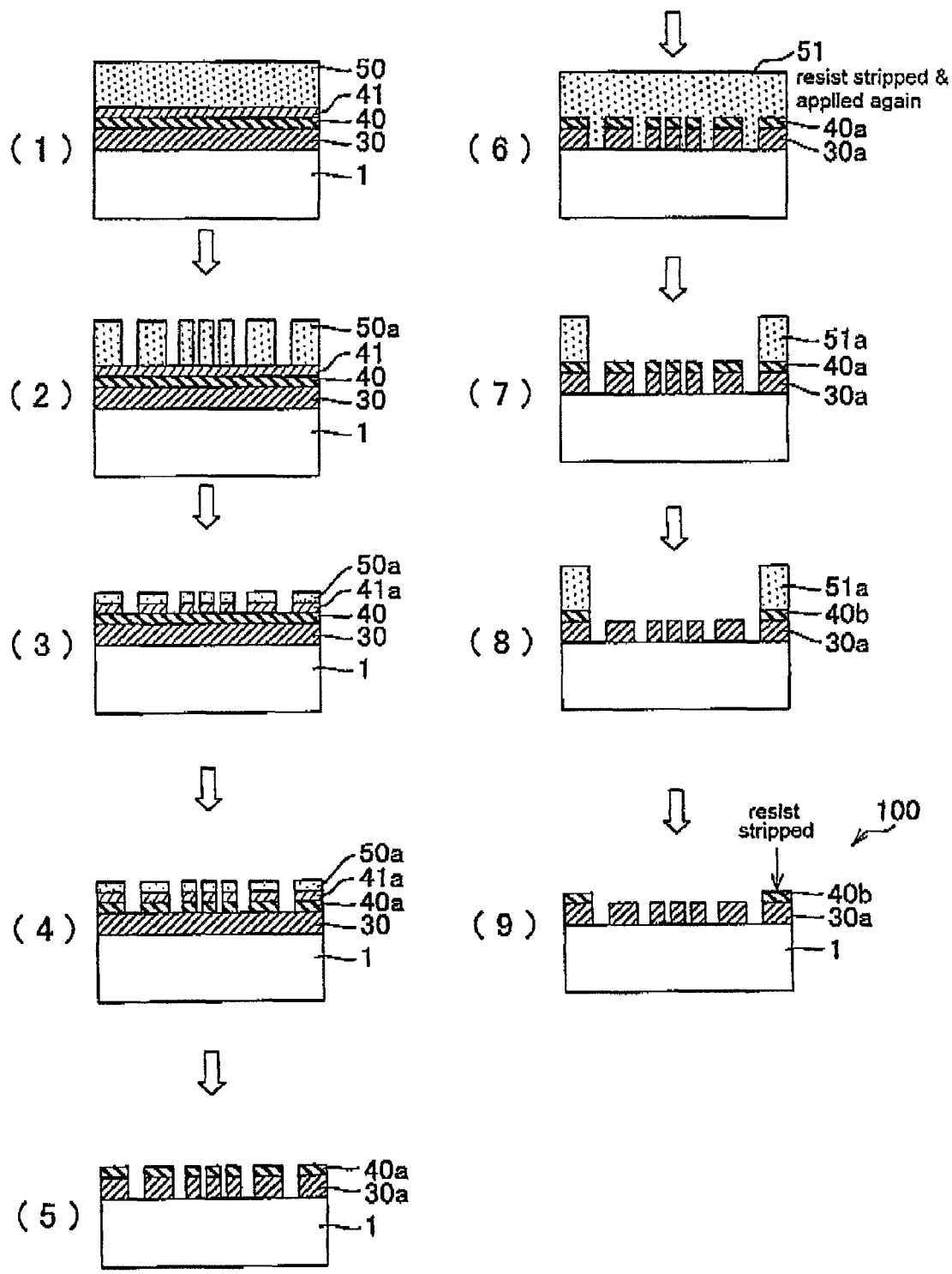
FIG. 8 shows exemplary sectional views for explaining photomask manufacturing processes according to Comparative Example 2.

In FIG. 8, (1) shows one example of a photomask blank according to Comparative Example 2. This photomask blank comprises a halftone phase shift film 30, a light-shielding film 40 being a layer serving as an etching mask film and also adapted for forming a light-shielding part (light-shielding band), an etching mask film 41 for the light-shielding film 40, and a resist film 50 which are formed in this order on a light-transmissive substrate 1.

[Manufacture of Photomask Blank]

Referring to FIG. 8, a description will be given of photomask blank and photomask manufacturing methods according to Comparative Example 2.

First, using a mixed target of molybdenum (Mo) and silicon (Si) (Mo:Si=1:9 [at %]), reactive sputtering was carried out in a mixed gas atmosphere of argon (Ar) and nitrogen ($N_2$) (Ar:$N_2$=10:90 [vol %]; pressure: 0.3 [Pa]), thereby forming a MoSiN-based light-semitransmissive phase shift film 30 having a thickness of 69 nm on an upper surface of a light-transmissive substrate 1 (FIG. 8, (1)). In this event, the thickness of the phase shift film 30 was adjusted so as to obtain a phase difference of 180°. The transmittance of the phase shift film 30 for ArF exposure light (wavelength: 193 nm) was 6%. The phase shift film 30 exhibited an OD of 1.2 for ArF exposure light (wavelength: 193 nm).

Then, a light-shielding film 40 for light-shielding part (light-shielding band) formation serving also as an etching mask film and comprising a CrN layer, a CrC layer, and a CrON layer was formed on the phase shift film 30 using an in-line type sputtering apparatus in which a plurality of chromium (Cr) targets were disposed in a chamber (FIG. 8, (1)).

Specifically, first, reactive sputtering was carried out in a mixed gas atmosphere of argon (Ar), nitrogen ($N_2$), and helium (He) (Ar:$N_2$:He=30:30:40 [vol %]; pressure: 0.17 [Pa]), thereby forming a CrN layer. Subsequently, reactive sputtering was carried out in a mixed gas atmosphere of argon (Ar), methane ($CH_4$), and helium (He) (Ar:$CH_4$:He=49:11:40 [vol %]; pressure: 0.52 [Pa]), thereby forming a CrC layer. Subsequently, reactive sputtering was carried out in a mixed gas atmosphere of argon (Ar) and nitrogen monoxide (NO) (Ar:NO=90:10 [vol %]; pressure: 0.52 [Pa]), thereby forming a CrON layer on the CrC layer. The light-shielding film 40 in the form of the three-layer laminated film was continuously formed using the in-line type sputtering apparatus and thus configured such that the components thereof continuously changed in a thickness direction thereof. The total thickness of the light-shielding film 40 was 48 nm. The light-shielding film 40 exhibited an OD of 1.9 for ArF exposure light (wavelength: 193 nm).

Then, using a single-wafer sputtering apparatus, an etching mask film 41 was formed on the light-shielding film 40 (FIG. 8, (1)). Specifically, using a Si target, reactive sputtering was carried out in a mixed gas atmosphere of argon (Ar), nitrogen ($N_2$), and oxygen ($O_2$), thereby forming SiON to a thickness of 15 nm.

The sheet resistance was measured for the sample at the stage where the etching mask film 41 was formed, and it was 100Ω/square.

Then, as shown at (1) in FIG. 8, a resist film 50 of a chemically amplified positive resist for electron beam writing (exposure) (PRL009: manufactured by FUJIFILM Electronic Materials Co., Ltd.) was applied to a thickness of 250 nm on the etching mask film 41 by a spin-coating method.

[Manufacture of Photomask]

Using a photomask blank thus fabricated as shown at (1) in FIG. 8, a desired pattern was written on the resist film 50 by the use of an electron beam writing apparatus and then development was carried out using a predetermined developer, thereby forming a resist pattern 50a (FIG. 8, (2)).

Then, using the resist pattern 50a as a mask, the etching mask film 41 was dry-etched, thereby forming an etching mask film pattern 41a (FIG. 8, (3)). In this event, a mixed gas of SF6 and He was used as a dry etching gas.

Then, using the resist pattern 50a and the etching mask film pattern 41a as a mask, the light-shielding film 40 was dry-etched, thereby forming a light-shielding film pattern 40a (FIG. 8, (4)). In this event, a mixed gas of $Cl_2$ and $O_2$ ($Cl_2$:$O_2$=4:1) was used as a dry etching gas.

Then, the resist pattern 50a was stripped and, using the light-shielding film pattern 40a as a mask, the phase shift film 30 was dry-etched with a mixed gas of SF6 and He, thereby forming a phase shift film pattern 30a (FIG. 8, (5)). By this dry etching, the etching mask film pattern 41a was simultaneously stripped.

Then, a resist film 51 of a positive resist for laser writing (exposure) (THMR-IP3500; manufactured by Tokyo Ohka Kogyo Co., Ltd.) was applied to a thickness of 465 nm on the light-shielding film pattern 40a by the spin-coating method (FIG. 8, (6)).

Then, using a laser writing apparatus, a light-shielding part (light-shielding band) pattern was written on the resist film 51 and then developed with a predetermined developer, thereby forming a resist pattern 51a (FIG. 8, (7)), Then, using the resist pattern 51a as a mask, the light-shielding film pattern 40a was dry-etched with a mixed gas of $Cl_2$ and $O_2$ ($Cl_2$:$O_2$=4:1), thereby forming a light-shielding part (light-shielding band) 40b (FIG. 8, (8)).

Then, the resist pattern 51a was stripped and then cleaning was carried out, thereby obtaining a photomask 100 having a light-shielding part (light-shielding band), comprising the light-shielding part (light-shielding band) 40b and the phase shift film pattern 30a, on the light-transmissive substrate 1 (FIG. 8, (9)).

[Evaluation]

The photomask thus obtained was evaluated.

As a result, in the photomask according to Comparative Example 2, the shift amount of CD (Critical Dimension) of the MoSiN-based halftone phase shift film pattern 30a with respect to CD of the light-shielding film pattern 40a was 6.8 nm.

The optical density of the light-shielding part (light-shielding band) as the total optical density of the light-shielding part (light-shielding band) 40b and the phase shift film pattern 30a was OD=3.1.

Further, with respect to the resolution of the transfer pattern formed on the photomask, it was difficult to resolve the MoSiN-based halftone phase shift film pattern 30a of 40 nm.

In view of the above, it was difficult to obtain a photomask suitable for the DRAM hp45 nm generation and further the hp32 nm generation.

For the generations prior to the hp45 nm generation, it is possible to form a main pattern with no problem in CD accuracy and it is also possible to ensure OD≧3 of the light-shielding part (light-shielding band) according to the method described in Comparative example 2. Therefore, it is reasonable to form a light-shielding part (light-shielding band) using a metal etching mask layer (to form a layer serving as both a metal etching mask layer and a light-shielding band forming layer) for the generations prior to the hp45 nm generation.

While this invention has been described with reference to the Examples, the technical scope of the invention is not limited to the scope of the description of the above-mentioned Examples. It is obvious to a person skilled in the art that various changes or improvements can be added to the above-mentioned Examples. It is clear from the description of claims that the modes added with such changes or improvements can also be included in the technical scope of this invention.

What is claimed is:

1. A photomask blank for fabricating a phase shift mask having a light-transmissive substrate provided with a phase shift part adapted to give a predetermined phase difference to transmitted exposure light,
   wherein said phase shift part is a dug-down part formed by digging down said light-transmissive substrate from a surface thereof to a digging depth adapted to produce the predetermined phase difference with respect to exposure light transmitted through said light-transmissive substrate at a portion where said phase shift part is not provided, said photomask blank comprising:
a light-shielding part not formed on a surface of a transfer pattern area of said light-transmissive substrate but formed in contact with a surface of a peripheral area around the transfer pattern area and adapted to shield exposure light; and
an etching mask film formed in contact with the surface of the transfer pattern area and with an upper surface of the light-shielding part,
wherein the light-shielding part is made of a material containing metal, and
wherein said etching mask film is made of a material containing metal which is substantially dry-etchable with a chlorine-based gas, but not substantially dry-etchable with a fluorine-based gas, said etching mask film serving as an etching mask at least until said digging depth is reached when forming said dug-down part.

2. The photomask blank according to claim 1, wherein the dug-down part is not formed on the surface of said light-transmissive substrate.

3. A photomask blank for fabricating a phase shift mask having a light-transmissive substrate provided with a phase shift part adapted to give a predetermined phase difference to transmitted exposure light,
wherein said phase shift part is a phase shift film formed on an upper surface of said light-transmissive substrate and adapted to give a predetermined phase change amount to said transmitted exposure light,
said photomask blank comprising:
a light-shielding part not formed on a surface of a transfer pattern area of said phase shift film but formed in contact with a surface of a peripheral area around the transfer pattern area and adapted to shield exposure light; and
an etching mask film formed in contact with the surface of the transfer pattern area and with an upper surface of the light-shielding part,
wherein the light-shielding part is made of a material containing metal, and
wherein said etching mask film is made of a material containing metal which is substantially dry-etchable with a chlorine-based gas, but not substantially dry-etchable with a fluorine-based gas, said etching mask film serving as an etching mask at least until a transfer pattern is formed in said phase shift film by dry etching with a fluorine-based gas.

4. The photomask blank according to claim 1 or 3, wherein said light-shielding part is made of a material mainly containing one of chromium, chromium nitride, chromium oxide, chromium oxynitride, and chromium oxycarbonitride.

5. The photomask blank according to claim 1 or 3, wherein said light-shielding part is made of a material mainly containing tantalum.

6. The photomask blank according to claim 1 or 3, wherein said light-shielding part has a thickness of 50nm to 100nm.

7. The photomask blank according to claim 1 or 3, wherein said etching mask film is made of a material mainly containing one of chromium, chromium nitride, chromium oxide, chromium oxynitride, and chromium oxycarbonitride.

8. The photomask blank according to claim 1 or 3, wherein said etching mask film has a thickness of 5nm to 40nm.

9. The photomask blank according to claim 1 or 3, wherein said etching mask film is also formed on an upper surface of said light-shielding part in said peripheral area.

10. The photomask blank according to claim 3, wherein said phase shift film is made of a material mainly containing one of molybdenum silicide, molybdenum silicide nitride, molybdenum silicide oxide, and molybdenum silicide oxynitride.

11. The photomask blank according to claim 3, wherein said phase shift film comprises:
a phase adjusting layer made of a material mainly containing one of silicon oxide and silicon oxynitride; and
a transmittance adjusting layer made of a material mainly containing one of tantalum and a tantalum-hafnium alloy.

12. A photomask fabricated using the photomask blank according to claim 1 or 3.

13. A method of manufacturing a phase shift mask having a light-transmissive substrate provided with a phase shift part adapted to give a predetermined phase difference to transmitted exposure light, said method comprising:
forming a light-shielding film in contact with a surface of said light-transmissive substrate, said light-shielding film being adapted to shield exposure light and made of a material containing metal;
removing said light-shielding film in a transfer pattern area by dry-etching using a resist film pattern as a mask, thereby forming a light-shielding part in a peripheral area around a transfer pattern area;
forming an etching mask film in contact with a surface of the transfer pattern area of said light-transmissive substrate and with an upper surface of the light-shielding part after said step of removing, said etching mask film being made of a material containing metal;
dry-etching said etching mask film with a chlorine-based gas by the use of a resist film pattern as a mask, thereby forming an etching mask film pattern; and
dry-etching said light-transmissive substrate with a fluorine-based gas by the use of said etching mask film pattern as a mask, thereby forming said phase shift part by digging down said light-transmissive substrate from the upper surface thereof to a digging depth adapted to produce said predetermined phase difference.

14. A method of manufacturing a phase shift mask having a light-transmissive substrate provided with a phase shift part adapted to give a predetermined phase difference to transmitted exposure light, said method comprising:
forming a phase shift film on an upper surface of said light-transmissive substrate, said phase shift film adapted to give a predetermined phase change amount to transmitted exposure light;
forming a light-shielding film in contact with a surface of said phase shift film, said light-shielding film being adapted to shield exposure light and made of a material containing metal;
removing said light-shielding film in a transfer pattern area by dry-etching using a resist film pattern as a mask, thereby forming a light-shielding part in a peripheral area around a transfer pattern area;
forming an etching mask film in contact with a surface of the transfer pattern area of said phase shift film and with an upper surface of the light-shielding part after said step of removing;
dry-etching said etching mask film with a chlorine-based gas by the use of a resist film pattern as a mask, thereby forming an etching mask film pattern; and
dry-etching said phase shift film with a fluorine-based gas by the use of said etching mask film pattern as a mask, thereby forming said phase shift part.

15. The method of claim 14, wherein said etching mask film is made of a material which is substantially dry-etchable with a chlorine-based gas but not substantially dry-etchable with a fluorine-based gas, and said etching mask film serves as an etching mask at least until said phase shift film is formed with a transfer pattern by dry-etching with the fluorine-based gas.

16. The photomask blank according to claim 3, wherein said phase shift film is not formed with a pattern.

17. The photomask blank according to claim 1 or 3, wherein said light-shielding part is of the light-shielding part alone or of laminated structure of the light-shielding portion and said etching mask film, and said light-shielding part has an optical density for ArF exposure light being of 3 or more.

18. The method of claim 13, wherein said etching mask film is made of a material which is substantially dry-etchable with a chlorine-based gas but not substantially dry-etchable with a fluorine-based gas, and said etching mask film serves as an etching mask at least until said digging depth is reached when forming said dug-down part.

* * * * *